United States Patent
Takihara

(10) Patent No.: US 11,721,696 B2
(45) Date of Patent: Aug. 8, 2023

(54) SEMICONDUCTOR INTEGRATED CIRCUIT, MOTOR DRIVER, AND MOTOR DRIVE SYSTEM

(71) Applicant: Rohm Co., Ltd., Kyoto (JP)

(72) Inventor: Hirotaka Takihara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 250 days.

(21) Appl. No.: 17/320,555

(22) Filed: May 14, 2021

(65) Prior Publication Data
US 2021/0358909 A1 Nov. 18, 2021

(30) Foreign Application Priority Data

May 15, 2020 (JP) .................. 2020-086013

(51) Int. Cl.
*H01L 27/092* (2006.01)
*H03K 17/687* (2006.01)
*H02P 7/03* (2016.01)

(52) U.S. Cl.
CPC .............. *H01L 27/092* (2013.01); *H02P 7/04* (2016.02); *H03K 17/6872* (2013.01)

(58) Field of Classification Search
CPC ......... H02P 7/04; H02P 8/00; H03K 17/6872; H03K 17/6871; H03K 2217/0045; H01L 29/1045; H01L 29/1083; H01L 29/7816
See application file for complete search history.

(56) References Cited

U.S. PATENT DOCUMENTS

| | | | |
|---|---|---|---|
| 8,829,975 B2* | 9/2014 | Aherne | H03K 17/6872 327/404 |
| 2009/0002060 A1* | 1/2009 | Giandalia | H03K 17/162 327/534 |
| 2015/0076598 A1* | 3/2015 | Takahashi | H01L 29/7818 257/337 |

FOREIGN PATENT DOCUMENTS

JP  2019-047104  3/2019

\* cited by examiner

*Primary Examiner* — Muhammad S Islam
(74) *Attorney, Agent, or Firm* — Fish & Richardson P.C.

(57) ABSTRACT

A semiconductor integrated circuit includes first to fourth transistor arrangement regions. A portion of the third transistor arrangement region is located on a second side in a first direction of the second transistor arrangement region. A portion of the first transistor arrangement region connected to the second transistor arrangement region is sandwiched in the first direction by the second transistor arrangement region and the portion of the third transistor arrangement region. The portion of the first transistor arrangement region is located on a first side in the first direction of the fourth transistor arrangement region. The portion of the third transistor arrangement region connected to the fourth transistor arrangement region is sandwiched in the first direction by the fourth transistor arrangement region and the portion of the first transistor arrangement region.

20 Claims, 17 Drawing Sheets

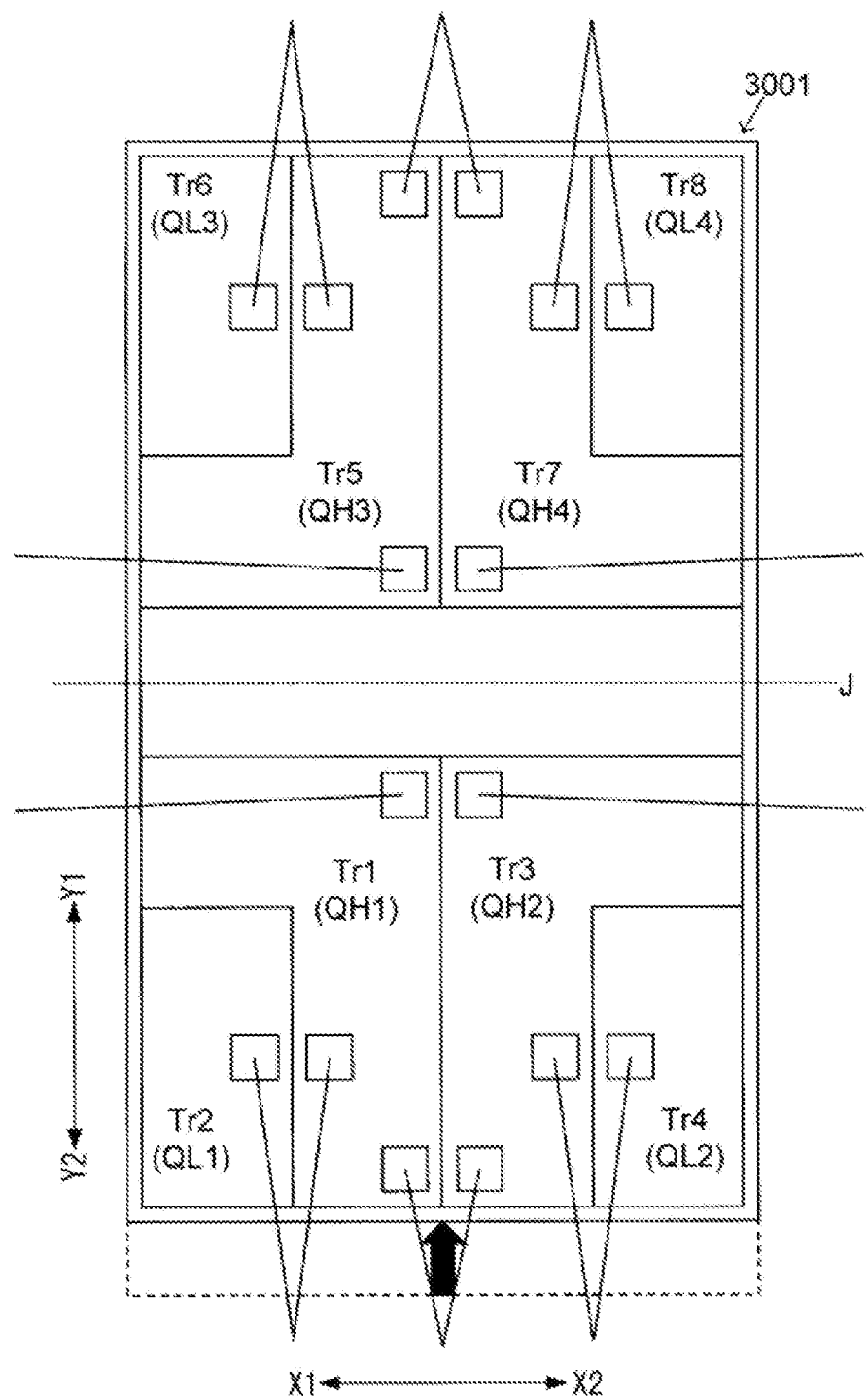

SEMICONDUCTOR INTEGRATED CIRCUIT, MOTOR DRIVER, AND MOTOR DRIVE SYSTEM

CROSS-REFERENCE TO RELATED APPLICATION

This application is based upon and claims the benefit of priority from Japanese Patent Application No. 2020-086013, filed on May 15, 2020, the entire contents of which are incorporated herein by reference.

TECHNICAL FIELD

The present disclosure relates to a semiconductor integrated circuit for driving a motor.

BACKGROUND

A semiconductor integrated circuit in which a motor drive circuit for driving a motor is integrated is known in the related art. The motor drive circuit may be provided with a circuit called a so-called H-bridge output stage. The H-bridge output stage is configured by combining two sets of half-bridge output stages. A half-bridge output stage is configured by connecting a high-side transistor and a low-side transistor in series. A motor, which is an object to be driven, is connected between a transistor connection node in one half-bridge output stage and a transistor connection node in the other half-bridge output stage.

A conventional semiconductor integrated circuit that integrates a motor drive circuit having the H-bridge output stage as described above is known.

In the conventional semiconductor integrated circuit, one half-bridge output stage is composed of a first P-channel MOS transistor QP1, which is an ED (Extended Drain) MOS transistor, and a first N-channel MOS transistor, which is an LD (Lateral Double-diffused) MOS transistor, and the other half-bridge output stage is composed of a second P-channel MOS transistor QP2, which is an EDMOS transistor, and a second N-channel MOS transistor, which is an LDMOS transistor.

Since a parasitic NPN bipolar transistor is formed between an N-type impurity region and a P-type semiconductor substrate, which are included in a plurality of transistors constituting the H-bridge output stage, when an hFE (DC current amplification factor) of the parasitic NPN bipolar transistor is large, there is a problem that a large parasitic current (collector-emitter current) exceeding an allowable limit flows.

Therefore, in the conventional semiconductor integrated circuit, in order to suppress such an hFE of the parasitic NPN bipolar transistor, each of a distance between a first impurity region included in the first P-channel MOS transistor QP1 and a second impurity region included in the first N-channel MOS transistor QN1, a distance between a third impurity region included in the second P-channel MOS transistor QP2 and a fourth impurity region included in the second N-channel MOS transistor QN2, and a distance between the second impurity region and the fourth impurity region is made larger than a distance between the first impurity region and the third impurity region.

However, as in the conventional semiconductor integrated circuit, as a means for suppressing the parasitic current flowing through the parasitic bipolar transistor formed in the H-bridge output stage, when a method of increasing the distance between the impurity regions, that is, a distance between the transistors, is used, a circuit area of the semiconductor integrated circuit may increase if the method is not used properly.

SUMMARY

Some embodiments of the present disclosure provide a semiconductor integrated circuit for driving a motor, which can reduce a circuit area while suppressing a parasitic current.

A semiconductor integrated circuit according to an aspect of the present disclosure includes: a first integrated H-bridge output stage including a first half-bridge output stage having a first high-side transistor of a P-channel type or N-channel type and a first low-side transistor of an N-channel type connected in series with the first high-side transistor, and a second half-bridge output stage having a second high-side transistor of a P-channel type or N-channel type and a second low-side transistor of an N-channel type connected in series with the second high-side transistor. A portion of a third transistor arrangement region in which the second high-side transistor is disposed is located on a second side in a first direction of a second transistor arrangement region in which the first low-side transistor is disposed. A portion of a first transistor arrangement region in which the first high-side transistor is disposed is located so as to be sandwiched in the first direction by the second transistor arrangement region and the portion of the third transistor arrangement region, and is connected to the second transistor arrangement region. The portion of the first transistor arrangement region is located on a first side in the first direction of a fourth transistor arrangement region in which the second low-side transistor is disposed. The portion of the third transistor arrangement region is located so as to be sandwiched in the first direction by the fourth transistor arrangement region and the portion of the first transistor arrangement region, and is connected to the fourth transistor arrangement region (first configuration).

In the first configuration, the first transistor arrangement region may include: a first partial region that is connected to a first side in a second direction, which is a direction orthogonal to the first direction, of the second transistor arrangement region, and extends in the first direction; and a second partial region that is connected to the second side in the first direction of the second transistor arrangement region and the second side in the second direction of the first partial region, and extends in the second direction. The third transistor arrangement region may include: a third partial region that is connected to the first side in the second direction of the fourth transistor arrangement region, and extends in the first direction; and a fourth partial region that is connected to the first side in the first direction of the fourth transistor arrangement region and the second side in the second direction of the third partial region, and extends in the second direction (second configuration).

In the second configuration, the semiconductor integrated circuit may further include a square region that is formed in a square shape having sides extending in the first direction and the second direction, respectively, in a plan view, and is divided into a first division region on the first side in the first direction and a second division region on the second side in the first direction. The second transistor arrangement region is formed in a square shape having sides extending in the first direction and the second direction, respectively, in a plan view. A corner on the first side in the first direction and the second side in the second direction in the second transistor arrangement region may coincide with a corner on the first side in the first direction and the second side in the second direction in the first division region. The fourth transistor arrangement region may be formed in a square shape having sides extending in the first direction and the second direction, respectively, in a plan view. A corner on the second side in the first direction and the second side in the second direction in the fourth transistor arrangement region may coincide with a corner on the second side in the first direction and the second side in the second direction in the second division region (third configuration).

In the third configuration, an area of the first transistor arrangement region in a plan view may be twice an area of the second transistor arrangement region in a plan view. An area of the third transistor arrangement region in a plan view may be twice an area of the fourth transistor arrangement region in a plan view. The area of the first transistor arrangement region may be equal to the area of the third transistor arrangement region (fourth configuration).

In the fourth configuration, a length of the side extending in the first direction of the second transistor arrangement region may be half of the length of a side extending in the first direction of the first division region. A length of the side extending in the first direction of the fourth transistor arrangement region may be half of the length of a side extending in the first direction of the second division region (fifth configuration).

In any one of the second to fifth configurations, the semiconductor integrated circuit may further include: a lower layer wiring portion including first to fourth drain lower layer wirings and first to fourth source lower layer wirings; a middle layer wiring portion including first to fourth drain middle layer wirings and first to fourth source middle layer wirings; and an upper layer wiring portion including first and second drain upper layer wirings and first and second source upper layer wirings. In the first transistor arrangement region, the first drain lower layer wirings and the first source lower layer wirings, which extend in the first direction, may be arranged alternately side by side in the second direction, and a length in the first direction of the first drain lower layer wirings and the first source lower layer wirings in the second partial region may be shorter than a length in the first direction of the first drain lower layer wirings and the first source lower layer wirings in the first partial region. In the second transistor arrangement region, the second drain lower layer wirings and the second source lower layer wirings, which extend in the first direction, may be arranged alternately side by side in the second direction. In the third transistor arrangement region, the third drain lower layer wirings and the third source lower layer wirings, which extend in the first direction, may be arranged alternately side by side in the second direction, and a length in the first direction of the third drain lower layer wirings and the third source lower layer wirings in the fourth partial region may be shorter than a length in the first direction of the third drain lower layer wirings and the third source lower layer wirings in the third partial region. In the fourth transistor arrangement region, the fourth drain lower layer wirings and the fourth source lower layer wirings, which extend in the first direction, may be arranged alternately side by side in the second direction. In the first transistor arrangement region, the first drain middle layer wirings and the first source middle layer wirings, which extend in the second direction, may be arranged alternately side by side in the first direction, and a length in the second direction of the first drain middle layer wirings and the first source middle layer wirings arranged in a portion of the first partial region on the first side in the first direction may be shorter than a length in the second direction of the first drain middle layer wirings and the first source middle layer wirings arranged in a portion of the first partial region on the second side in the first direction and the second partial region. In the second transistor arrangement region, the second drain middle layer wirings and the second source middle layer wirings, which extend in the second direction, may be arranged alternately side by side in the first direction. In the third transistor arrangement region, the third drain middle layer wirings and the third source middle layer wirings, which extend in the second direction, may be arranged alternately side by side in the first direction, and a length in the second direction of the third drain middle layer wirings and the third source middle layer wirings arranged in a portion of the third partial region on the second side in the first direction may be shorter than a length in the second direction of the third drain middle layer wirings and the third source middle layer wirings arranged in a portion of the third partial region on the first side in the first direction and the fourth partial region. In the fourth transistor arrangement region, the fourth drain middle layer wirings and the fourth source middle layer wirings, which extend in the second direction, may be arranged alternately side by side in the first direction. First drain lower side vias may be arranged at positions where the first drain middle layer wirings and the first drain lower layer wirings overlap each other in a plan view. First source lower side vias may be arranged at positions where the first source middle layer wirings and the first source lower layer wirings overlap each other in a plan view. Second drain lower side vias may be arranged at positions where the second drain middle layer wirings and the second drain lower layer wirings overlap each other in a plan view. Second source lower side vias may be arranged at positions where the second source middle layer wirings and the second source lower layer wirings overlap each other in a plan view. Third drain lower side vias may be arranged at positions where the third drain middle layer wirings and the third drain lower layer wirings overlap each other in a plan view. Third source lower side vias may be arranged at positions where the third source middle layer wirings and the third source lower layer wirings overlap each other in a plan view. Fourth drain lower side vias may be arranged at positions where the fourth drain middle layer wirings and the fourth drain lower layer wirings overlap each other in a plan view. Fourth source lower side vias may be arranged at positions where the fourth source middle layer wirings and the fourth source lower layer wirings overlap each other in a plan view. The first source upper layer wiring may have an extending portion that overlaps an end of the first transistor arrangement region on the first side in the second direction and an end of the third transistor arrangement region on the first side in the second direction in a plan view and extends in the first direction, and a protruding portion that protrudes from a center of the extending portion in the first direction toward the second side in the second direction. The first drain upper layer wiring and the second drain upper layer wiring may be disposed on the second side of the first source upper layer wiring in the second direction and arranged side by side in the first direction to sandwich the protruding portion from both sides in the first direction. The first drain upper layer wiring may be formed so as to overlap the first transistor arrangement region and the second transistor arrangement region in a plan view. The second drain upper layer wiring may be disposed on the second side of the first drain upper layer wiring in the first direction, and may be formed so as to overlap the third transistor arrangement region and the fourth transistor arrangement region in a plan view. The second source upper layer wiring may be formed so as to overlap the first to fourth transistor arrangement regions in a plan view and extend in the first direction, and may be disposed on the second side of the first drain upper layer wiring, the protruding portion, and the second drain upper layer wiring in the second direction. First source upper side vias may be arranged at positions where the first source upper layer wiring and the first source middle layer wirings overlap each other in a plan view. Third source upper side vias may be arranged at positions where the first source upper layer wiring and the third source middle layer wirings overlap each other in a plan view. First drain upper side vias may be arranged at positions where the first drain upper layer wiring and the first drain middle layer wirings overlap each other in a plan view. Second drain upper side vias may be arranged at positions where the first drain upper layer wiring and the second drain middle layer wirings overlap each other in a plan view. Third drain upper side vias may be arranged at positions where the second drain upper layer wiring and the third drain middle layer wirings overlap each other in a plan view. Fourth drain upper side vias may be arranged at positions where the second drain upper layer wiring and the fourth drain middle layer wirings overlap each other in a plan view. Second source upper side vias may be arranged at positions where the second source upper layer wiring and the second source middle layer wirings overlap each other in a plan view. Fourth source upper side vias may be arranged at positions where the second source upper layer wiring and the fourth source middle layer wirings overlap each other in a plan view (sixth configuration).

In any one of the second to sixth configurations, the semiconductor integrated circuit may further include a second H-bridge output stage that includes: a third half-bridge output stage having a third high-side transistor of a P-channel type or N-channel type and a third low-side transistor of an N-channel type connected in series with the third high-side transistor; and a fourth half-bridge output stage having a fourth high-side transistor of a P-channel type or N-channel type and a fourth low-side transistor of an N-channel type connected in series with the fourth high-side transistor. A layout of a fifth transistor arrangement region in which the third high-side transistor is disposed, a sixth transistor arrangement region in which the third low-side transistor is disposed, a seventh transistor arrangement region in which the fourth high-side transistor is disposed, and an eighth transistor arrangement region in which the fourth low-side transistor is disposed may be line-symmetric with the first to fourth transistor arrangement regions with respect to a symmetric axis extending in the first direction (seventh configuration).

In any one of the first to seventh configurations, each of the first high-side transistor and the second high-side transistor may be a P-channel type (eighth configuration).

In any one of the eighth configurations, each of the first high-side transistor and the second high-side transistor may be a PDMOS (P-channel DMOS (Double-Diffused MOSFET)), and each of the first low-side transistor and the second low-side transistor may be an NDMOS (N-channel DMOS) (ninth configuration).

A motor driver according to an aspect of the present disclosure is configured by packaging the semiconductor integrated circuit of any one of the first to ninth configurations.

A motor drive system according to an aspect of the present disclosure includes the motor driver described above, and a motor connected to the first half-bridge output stage and the second half-bridge output stage in the semiconductor integrated circuit.

BRIEF DESCRIPTION OF DRAWINGS

FIG. 10 is a plan view showing a transistor arrangement region in a semiconductor integrated circuit according to a modification of the present disclosure.

DETAILED DESCRIPTION

Exemplary Embodiments of the Present Disclosure will be now Described with Reference to the Drawings.
<Motor Drive System>

Figure 1:
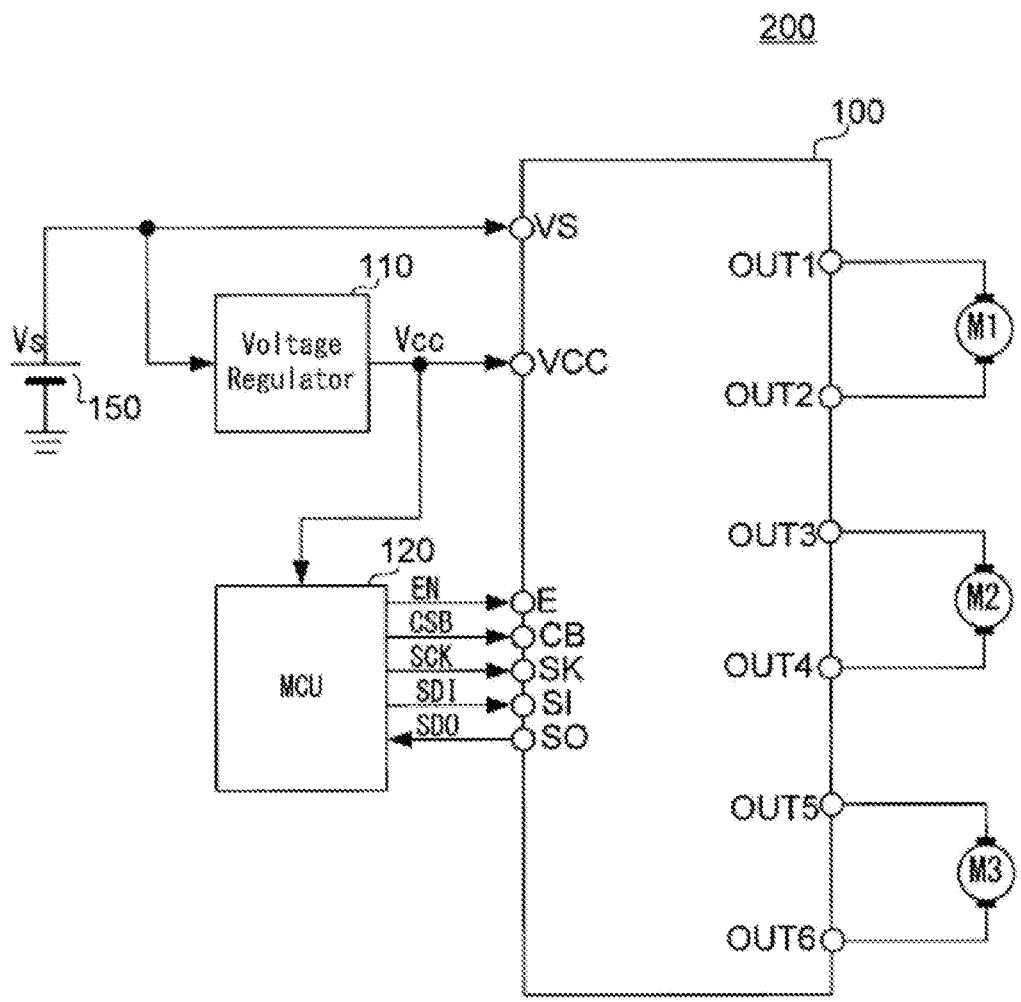
FIG. 1 is a diagram showing a configuration of a motor drive system according to an exemplary embodiment of the present disclosure.

FIG. 1 is a diagram showing a configuration of a motor drive system according to an exemplary embodiment of the present disclosure. A motor drive system 200 shown in FIG.

1 is for in-vehicle use as an example, and includes a motor driver 100 configured as a semiconductor device, a voltage regulator 110, an MCU (Micro Control Unit) 120, and motors M1 to M3. The motor driver 100, the voltage regulator 110, and the MCU 120 are included in an ECU (Electronic Control Unit).

As terminals for establishing electrical connection with the outside, the motor driver 100 includes a power supply terminal VS, a power supply terminal VCC, an enable terminal E, a chip select terminal CB, a clock signal input terminal SK, an input data terminal SI, an output data terminal SO, and output terminals OUT1 to OUT6.

A power supply voltage Vs, which is a DC voltage, is applied from a battery power supply 150 to the power supply terminal VS. The power supply voltage Vs is, for example, 12 V. The voltage regulator 110 converts the power supply voltage Vs into a power supply voltage Vcc which is a DC voltage. The power supply voltage Vcc is a voltage lower than the power supply voltage Vs and is, for example, 5 V or 3.3 V. The power supply voltage Vcc is applied to the power supply terminal VCC and is supplied to the MCU 120.

The MCU 120 communicates with the motor driver 100 via the enable terminal E, the chip select terminal CB, the clock signal input terminal SK, the input data terminal SI, and the output data terminal SO. This will be described later, but in particular, by being provided with the chip select terminal CB, the clock signal input terminal SK, the input data terminal SI, and the output data terminal SO, that the motor driver 100 can perform communication using a serial communication method which will be described later.

The motors M1 to M3 are motors with a DC brush. The motor M1 is connected between the output terminals OUT1 and OUT2. The motor M2 is connected between the output terminals OUT3 and OUT4. The motor M3 is connected between the output terminals OUT5 and OUT6. The motor driver 100 can drive the motors M1 to M3 by outputs from the output terminals OUT1 to OUT6.

<Motor Driver>

Figure 2:
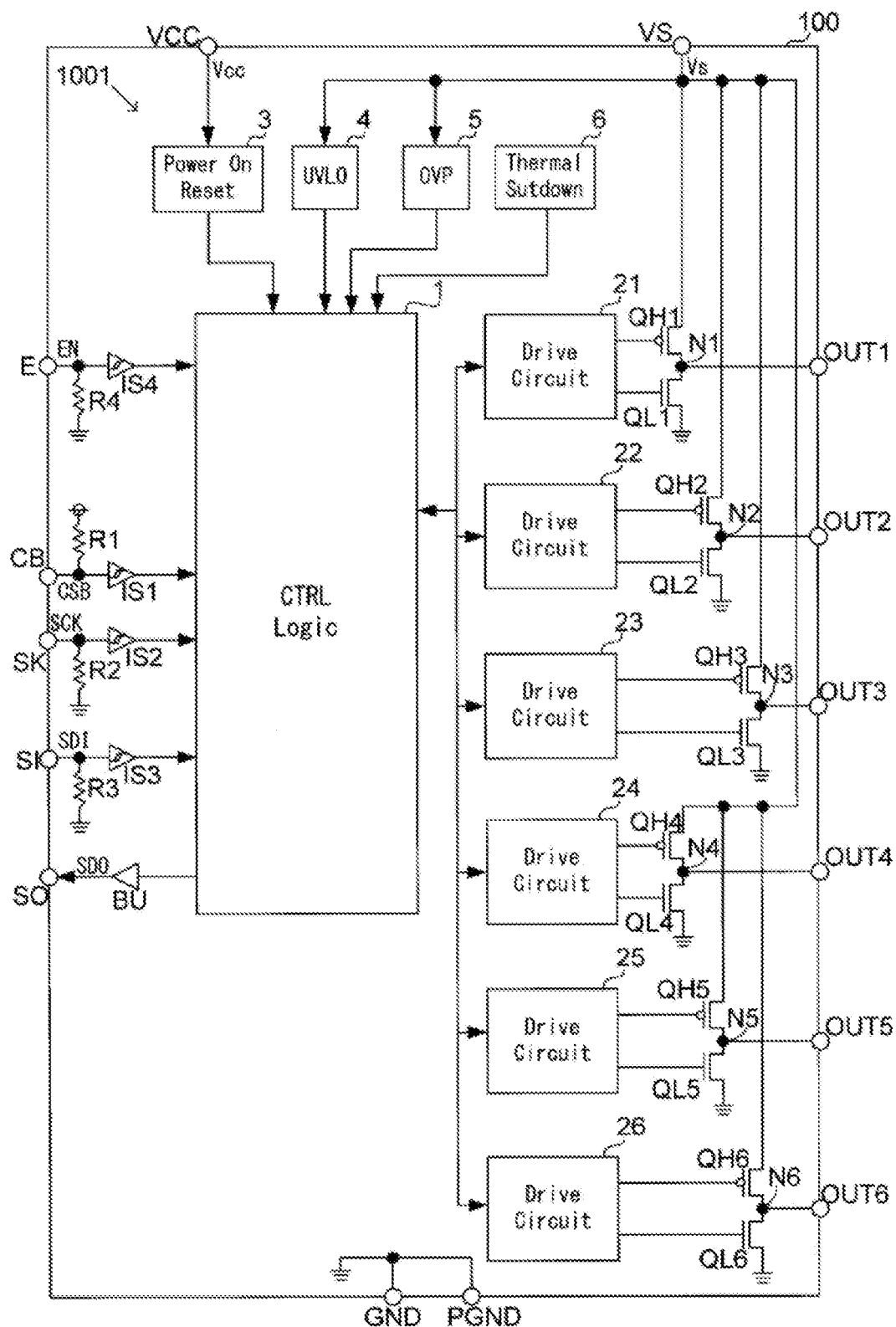
FIG. 2 is a block diagram showing an example of an internal configuration of a motor driver.

FIG. 2 is a block diagram showing an example of an internal configuration of the motor driver 100. The motor driver 100 is a product in which a semiconductor integrated circuit (semiconductor chip) 1001 is packaged. That is, terminals such as the power supply terminal VS are formed as lead terminals, and are connected to pads (not shown) of the semiconductor integrated circuit 1001 by wires.

The semiconductor integrated circuit 1001 includes a control logic circuit 1, drive circuits 21 to 26, a power-on reset part 3, an undervoltage protection part 4, an overvoltage protection part 5, a thermal shutdown part 6, Schmidt inverters IS1 to IS4, a buffer BU, resistors R1 to R4, high-side transistors QH1 to QH6, and low-side transistors QL1 to QL6, all of which are integrated into one chip.

The semiconductor integrated circuit 1001 has the high-side transistors QH1 to QH6 and low-side transistors QL1 to QL6, which form half-bridge output stages. The first high-side transistor QH1 and the first low-side transistor QL1 are paired to form one half-bridge output stage. Similarly, the second high-side transistor QH2 and the second low-side transistor QL2, the third high-side transistor QH3 and the third low-side transistor QL3, the fourth high-side transistor QH4 and the fourth low-side transistor QL4, the fifth high-side transistor QH5 and the fifth low-side transistor QL5, and the sixth high-side transistor QH6 and the sixth low-side transistor QL6 are also paired, respectively, to form separate half-bridge output stages.

As an example, the high-side transistors QH1 to QH6 are formed of PDMOS (P-channel DMOS (Double-Diffused MOSFET)), and the low-side transistors QL1 to QL6 are formed of NDMOS (N-channel DMOS).

As described above, the motor driver 100 is provided with six output terminals OUT1 to OUT6. The output terminals OUT1 to OUT6 are respectively connected to connection nodes N1 to N6 to which the high-side transistors and low-side transistors in the respective half-bridge output stages are connected.

As shown in FIG. 1 described above, the motor M1 is connected between the output terminal OUT1 and the output terminal OUT2, the motor M2 is connected between the output terminal OUT3 and the output terminal OUT4, and the motor M3 is connected between the output terminal OUT5 and the output terminal OUT6. That is, a motor is connected between one half-bridge output stage and the other half-bridge output stage, and is driven by the H-bridge output stage (also called a full-bridge output stage). It is well known that if a motor is driven by an H-bridge output stage, it becomes easy to switch the motor between forward rotation and reverse rotation and brake the motor.

The drive circuits 21 to 26, which also function as overcurrent protection parts, are connected to input sides of the half-bridge output stages, that is, gates of the high-side transistors QH1 to QH6 and low-side transistors QL1 to QL6, respectively.

One of the features of the motor driver 100 is that the high-side transistors QH1 to QH6 and the low-side transistors QL1 to QL6 can be controlled to be driven by serial interface communication. The serial interface communication is a serial communication method that transmits data while synchronizing with a clock signal. The control logic circuit 1 plays the role of a slave in the serial interface communication. The chip select terminal CB, the clock signal input terminal SK, the input data terminal SI, the output data terminal SO, and the enable terminal E are prepared as external terminals related to the control logic circuit 1. The MCU 120 (see FIG. 1) as a master is connected to these five external terminals. The MCU 120 sends a clock signal SCK, a chip select signal CSB, and input data SDI to the control logic circuit 1, and also receives output data SDO from the control logic circuit 1 which is the slave. The serial interface communication adopted in the present embodiment is a well-known communication method called Serial Peripheral Interface (SPI), which is relatively often adopted in in-vehicle use and the like.

The chip select signal CSB, which corresponds to an address signal given by the master, is input to the chip select terminal CB. The SPI communication is possible while the chip select signal CSB input to the chip select terminal CB is at a low level. Therefore, the SPI communication protocol is executed with so-called negative logic. The chip select terminal CB is connected to the power supply terminal VCC via the resistor R1 built in the semiconductor integrated circuit 1001. The resistor R1 is a so-called pull-up resistor and holds the chip select terminal CB at a voltage level of the power supply terminal VCC. With such a configuration, when the chip select signal CSB input from the MCU 120 is not input to the chip select terminal CB, the potential of the chip select terminal CB is held at a high level, so that the execution of SPI communication is blocked.

The Schmidt inverter IS1 is connected to the chip select terminal CB in addition to the resistor R1. The Schmidt inverter IS1 is an inverter having so-called hysteresis, which has different threshold values in rising and falling edges of the chip select signal CSB, and prevents malfunction when noise is mixed in a signal input to the chip select terminal CB.

The clock signal SCK used for the SPI communication is input to the clock signal input terminal SK. The SPI communication is possible during a period in which a negative signal (low level signal) is input to the chip select terminal CB and while the clock signal SCK is input. The resistor R2 and the Schmidt inverter IS2 are connected to the clock signal input terminal SK. The resistor R2 is a so-called pull-down resistor and holds the clock signal input terminal SK at a low level while the clock signal SCK is not input to the clock signal input terminal SK. The Schmidt inverter IS2 is adopted for the same purpose as the Schmidt inverter IS1 and is prepared to prevent malfunction of the SPI communication caused by noise.

The input data SDI is input from the MCU 120 to the input data terminal SI. The input data SDI is determined correspondingly to each clock signal SCK input to the clock signal input terminal SK. For example, when the control logic circuit 1 has a 16-bit register, sixteen types of input data SDI can be set. The resistor R3 and the Schmidt inverter IS3 are connected to the input data terminal SI. The resistor R3 is a so-called pull-down resistor and holds the input data terminal SI at a low level while no signal is input to the input data terminal SI. The Schmidt inverter IS3 is prepared for the same purpose as the Schmidt inverters IS1 and IS2. That is, the Schmidt inverter IS3 prevents malfunction of the SPI communication when undesired noise reaches the input data terminal SI.

The output data SDO is output from the output data terminal SO toward the MCU 120. As the output data SDO output from the output data terminal SO, signals determined based on various input signals input to the input data terminal SI are output. When the control logic circuit 1 has, for example, a 16-bit register, sixteen types of output data SDO are output. The control logic circuit 1 and the output data terminal SO are connected to each other via the buffer BU so as to suppress interference caused therebetween.

The enable terminal E is used, for example, to release a state in which overcurrent protection is activated. An enable signal EN is applied to the enable terminal E. The enable terminal E is not necessarily an essential configuration requirement for the SPI communication. The resistor R4 is connected to the enable terminal E, and the Schmidt inverter IS4 is further connected to the enable terminal E. The Schmidt inverter IS4 is prepared for the same purpose as the Schmidt inverters IS1 to IS3. That is, the Schmidt inverter IS4 prevents malfunction of the SPI communication and the entire motor driver 100 when undesired noise reaches the enable terminal E.

The power-on reset part 3 resets the control logic circuit 1 when the power supply voltage Vcc supplied to the control logic circuit 1 falls below a predetermined magnitude. For example, when a normal usage range of the power supply voltage Vcc is 4.5 V to 5.5 V, it is considered that the circuit function of the control logic circuit 1 cannot be sufficiently guaranteed when the power supply voltage Vcc becomes 3.8 V, and the control logic circuit 1 is reset.

The undervoltage protection part 4 holds all of the output terminals OUT1 to OUT6 at high impedance (Hi-Z) when the power supply voltage Vs supplied to the power supply terminal VS falls below a predetermined magnitude. For example, when a usage range of the power supply voltage Vs of the power supply terminal VS is 8 V to 36 V, all of the high-side transistors QH1 to QL1 and the low-side transistors QL1 to QL6 are turned off to hold all the output terminals at the high impedance (Hi-Z) when the power supply voltage Vs becomes, for example, 4.6 V or less. In addition, when the power supply voltage becomes, for example, 5.1 V or more, the output can be restored again and self-reset so as to return to a normal operation. Of course, it is also possible to latch the output without self-resetting, and the selection thereof is set by an internal register (not shown) of the control logic circuit 1.

The overvoltage protection part 5 holds all of the output terminals OUT1 to OUT6 at the high impedance (Hi-Z) when the power supply voltage Vs supplied to the power supply terminal VS exceeds the predetermined magnitude. For example, when the usage range of the power supply voltage Vs of the power supply terminal VS is usually 8 V to 36 V, all of the high-side transistors QH1 to QL1 and the low-side transistors QL1 to QL6 are turned off to hold all the output terminals at the high impedance when the power supply voltage Vs becomes, for example, 50 V or more. In addition, when the power supply voltage Vs becomes, for example, 45 V or less, the output can be restored again and self-reset so as to return to the normal operation. Of course, it is also possible to latch the output without self-resetting, and the selection thereof is set by the register described above.

The thermal shutdown part 6 holds all of the output terminals OUT1 to OUT6 at the high impedance (Hi-Z) when a junction temperature of the semiconductor integrated circuit 1001 becomes, for example, 175 degrees C. or higher. The Hi-Z state is obtained by turning off all of the high-side transistors QH1 to QL1 and the low-side transistors QL1 to QL6. When the junction temperature drops from 175 degrees C. to 150 degrees C. or lower, the output can be restored again and self-reset so as to return to the normal operation. Of course, it is also possible to latch the output without self-resetting, and the selection thereof is set by the register described above.

The drive circuits 21 to 26 are provided with overcurrent protection parts (not shown) in addition to drive circuits. The overcurrent protection part determines that an overcurrent occurs when, for example, a current of 1.5 A flows through any one of the output terminals OUT1 to OUT6, and latches only an output terminal that detects the overcurrent, at the high impedance (Hi-Z). Therefore, for example, when only the output terminal OUT1 detects the overcurrent and the other output terminals OUT2 to OUT6 do not detect the overcurrent, both of the first high-side transistor QH1 and the first low-side transistor QL1, which are connected to the output terminal OUT1, are turned off to hold the output terminal OUT1 at the high impedance, but the high-side transistors QH2 to QH6 and the low-side transistors QL2 to QL6, which are connected to the output terminals OUT2 to OUT6, continue to operate according to the conditions instructed by the control logic circuit 1. Reset for releasing the latch may be performed by the register described above or by the enable terminal E.

The motor driver 100 has ground terminals GND and PGND in addition to the external terminals described so far, and these ground terminals are electrically connected in common by an internal wiring of the semiconductor integrated circuit 1001.

<Motor Drive by H-Bridge Output Stage>

Figure 3A:
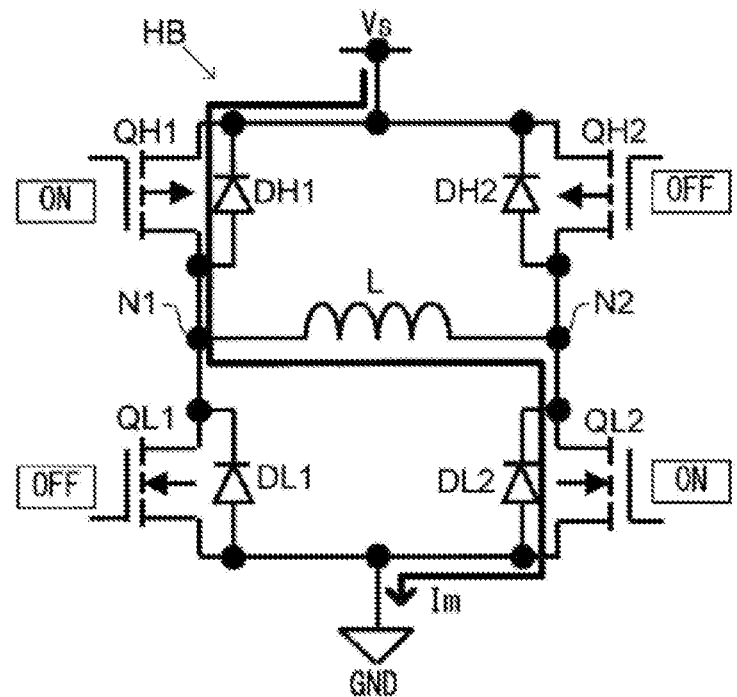
FIG. 3A is a diagram showing an example of a motor drive state by an H-bridge output stage.

Next, drive of the motor by the H-bridge output stage included in the motor driver 100 as described above will be described in detail. FIG. 3A is a diagram showing an example of a motor drive state by an H-bridge output stage HB composed of the high-side transistors QH1 and QH2 and the low-side transistors QL1 and QL2. Since each of H-bridge output stages composed of the other high-side transistors QH3 to QH6 and low-side transistors QL3 to QL6 is the same as the H-bridge output stage HB, the H-bridge output stage HB will be representatively described here.

As shown in FIG. 3A, the H-bridge output stage HB includes one half-bridge output stage composed of the first high-side transistor QH1 and the first low-side transistor QL1, and the other half-bridge output stage composed of the second high-side transistor QH2 and the second low-side transistor QL2.

More specifically, sources of the high-side transistors QH1 and QH2, which are PDMOSs, are connected in common to an application terminal of the power supply voltage Vs. A drain of the first high-side transistor QH1 and a drain of the first low-side transistor QL1, which is an NDMOS, are connected by a node N1. A drain of the second high-side transistor QH2 and a drain of the second low-side transistor QL2, which is an NDMOS, are connected by a node N2. An exciting coil L included in the motor M1 is connected between the node N1 and the node N2. Sources of the low-side transistors QL1 and QL2 are connected in common to an application terminal of the ground potential.

Further, as shown in FIG. 3A, the first high-side transistor QH1 has an upper parasitic diode DH1 of which forward direction is from the drain of the first high-side transistor QH1 toward the source thereof. The first low-side transistor QL1 has a lower parasitic diode DL1 of which forward direction is from the source of the first low-side transistor QL1 toward the drain thereof. The second high-side transistor QH2 has an upper parasitic diode DH2 of which forward direction is from the drain of the second high-side transistor QH2 toward the source thereof. The second low-side transistor QL2 has a lower parasitic diode DL2 of which forward direction is from the source of the second low-side transistor QL2 toward the drain thereof.

In FIG. 3A, as an example of a transistor control state, the first high-side transistor QH1 and the second low-side transistor QL2 are in a turned-on state, and the second high-side transistor QH2 and the first low-side transistor QL1 are in a turned-off state. In this state, as shown in FIG. 3A, a motor current Im flows in a current path from the application terminal of the power supply voltage Vs to the first high-side transistor QH1, the node N1, the exciting coil L, the node N2, the second low-side transistor QL2, and the application terminal of the ground potential, in this order, thereby rotating the motor M1, for example, in a forward direction.

Figure 3B:
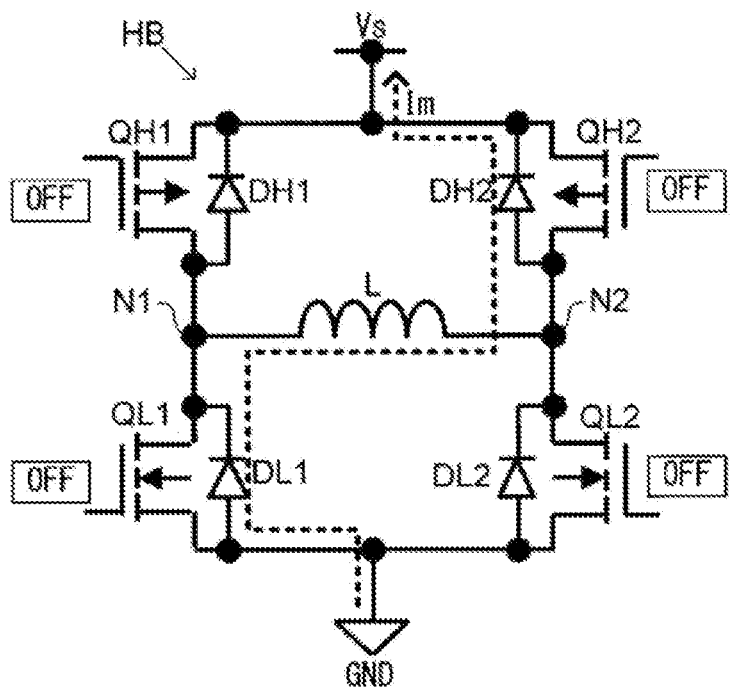
FIG. 3B is a diagram showing an example of a motor braking state by the H-bridge output stage.

In order to shift from the motor drive state of FIG. 3A to a braking state of stopping or decelerating the rotation of the motor M1, a transistor control state as shown in FIG. 3B is set. In the state shown in FIG. 3B, all the transistors QH1, QH2, QL1, and QL2 in the H-bridge output stage HB are turned off. As a result, as shown in FIG. 3B, the motor current Im flows in a current path from the application terminal of the ground potential to the lower parasitic diode DL1, the node N1, the exciting coil L, the node N2, the upper parasitic diode DH2, and the application terminal of the power supply voltage Vs, in this order, by a counter-electromotive force of the exciting coil L. That is, energy stored in the exciting coil L is not only consumed by resistance components in the current path (mainly the resistance component of the exciting coil L), but also consumed as regenerative energy to the power supply side. As a result, the motor current Im is attenuated rapidly.

In order to shift from the state shown in FIG. 3A to the braking state, in addition to the above, the high-side transistors QH1 and QH2 may be turned off and the low-side transistors QL1 and QL2 may be turned on. In this case, the motor current Im that has been flowing until then tries to continue to flow, and flows through a loop-shaped current path formed by the exciting coil L and the low-side transistors QL1 and QL2. As a result, the motor current Im is attenuated gradually as the energy stored in the exciting coil L is consumed by the resistance component in the current path.

Figure 3C:
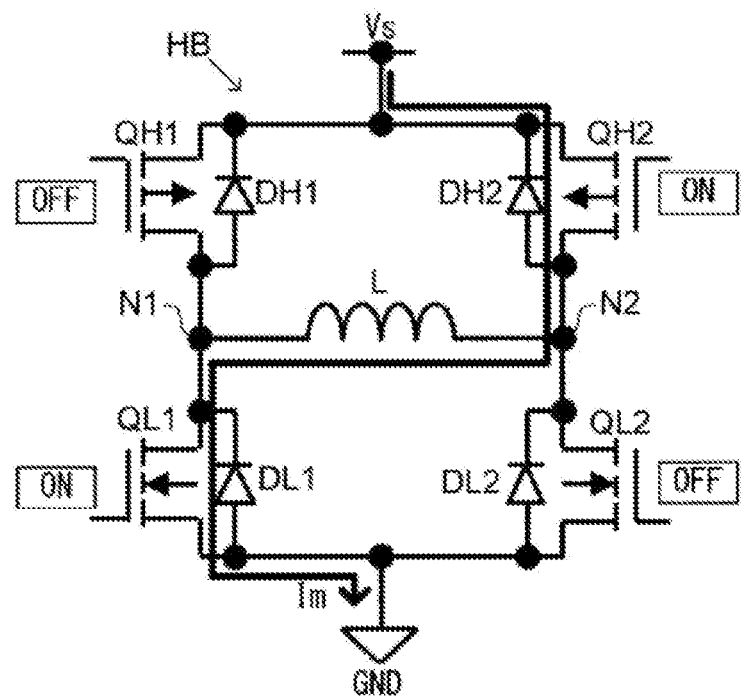
FIG. 3C is a diagram showing an example of the motor drive state by the H-bridge output stage.

Further, in FIG. 3C, as an example of the transistor control state, the second high-side transistor QH2 and the first low-side transistor QL1 are in a turned-on state, and the first high-side transistor QH1 and the second low-side transistor QL2 are in a turned-off state. In this state, as shown in FIG. 3C, a motor current Im flows in a current path from the application terminal of the power supply voltage Vs to the second high-side transistor QH2, the node N2, the exciting coil L, the node N1, the first low-side transistor QL1, and the application terminal of the ground potential, in this order, thereby rotating the motor M1, for example, in a backward direction (in a direction opposite to that in FIG. 3A).

Figure 3D:
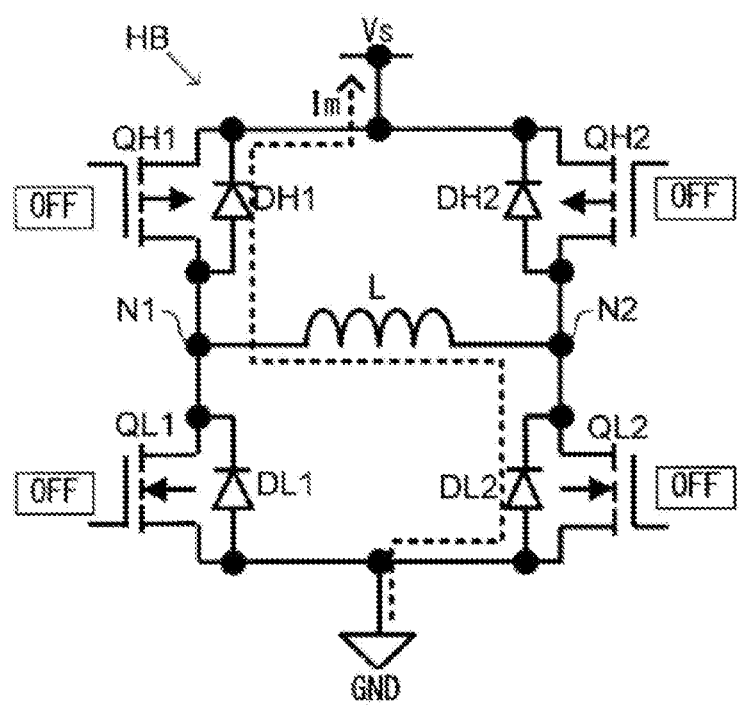
FIG. 3D is a diagram showing an example of the motor braking state by the H-bridge output stage.

In addition, in order to shift from the motor drive state of FIG. 3C to the braking state, a transistor control state as shown in FIG. 3D is set. In the state shown in FIG. 3D, as in FIG. 3B, all the transistors QH1, QH2, QL1, and QL2 in the H-bridge output stage HB are turned off. As a result, as shown in FIG. 3D, the motor current Im flows in a current path from the application terminal of the ground potential to the lower parasitic diode DL2, the node N2, the exciting coil L, the node N1, the upper parasitic diode DH1, and the application end of the power supply voltage Vs, in this order, by the counter-electromotive force of the exciting coil L. As a result, as in FIG. 3B, the motor current Im is attenuated rapidly.

In order to shift from the state shown in FIG. 3C to the braking state, as described above, the high-side transistors QH1 and QH2 may be turned off and the low-side transistors QL1 and QL2 may be turned on.

However, when the operation for the braking state as shown in FIG. 3B or FIG. 3D as described above is performed, there is a possibility that an unintended latch-up may occur in the semiconductor integrated circuit 1001. Here, a latch-up will be described.

Figure 4:
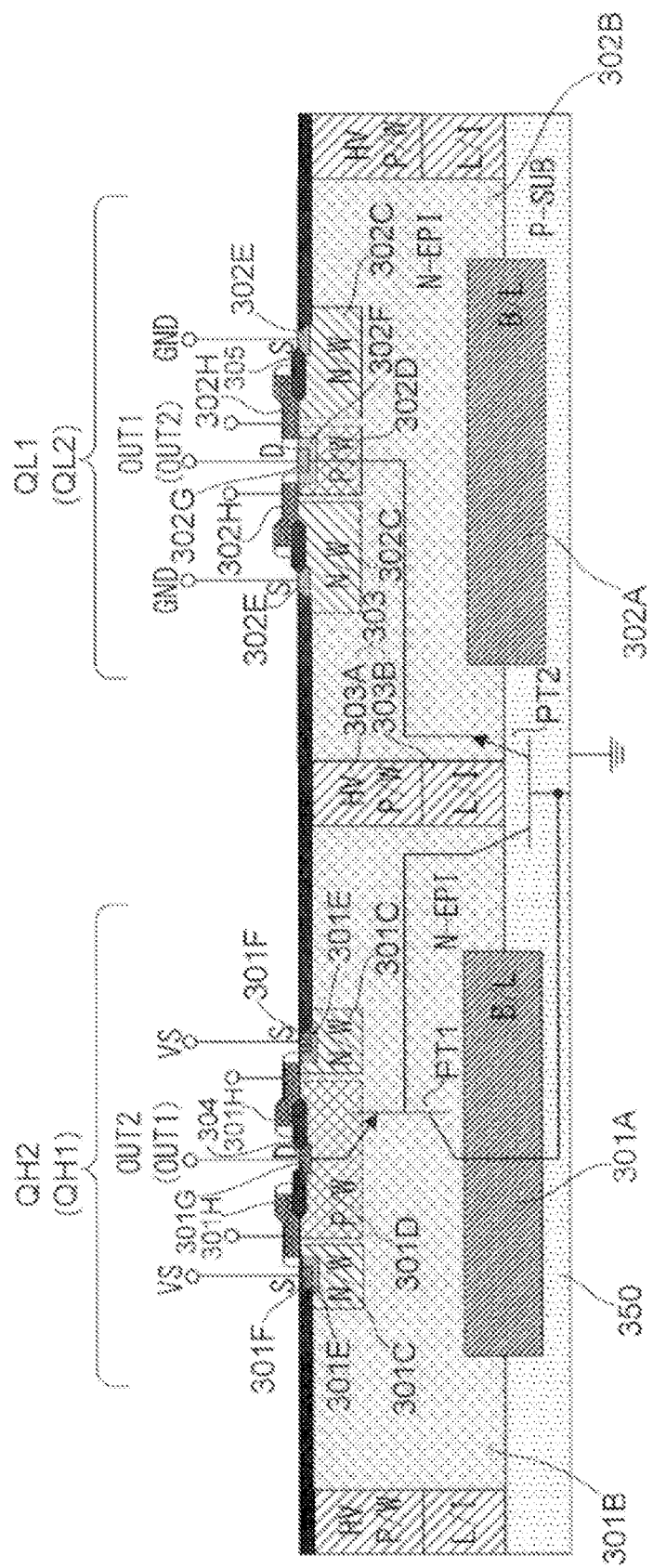
FIG. 4 is a cross-sectional view showing an example of a vertical structure of a high-side transistor and a low-side transistor for explaining a latch-up.

FIG. 4 is a cross-sectional view showing an example of a vertical structure of the second high-side transistor QH2 and the first low-side transistor QL1 for explaining a latch-up. Note that FIG. 4 can be also regarded as showing a vertical structure of the first high-side transistor QH1 and the second low-side transistor QL2, but for the sake of convenience, the transistors shown in FIG. 4 will be representatively described as being the second high-side transistor QH2 and the first low-side transistor QL1.

As described above, the second high-side transistor QH2 is composed of a PDMOS, and the first low-side transistor QL1 is composed of an NDMOS. Both of the second high-side transistor QH2 and the first low-side transistor QL1 are formed on a P-type semiconductor substrate 350. The P-type semiconductor substrate 350 is connected to the application terminal of the ground potential.

The second high-side transistor QH2 and the first low-side transistor QL1 are formed in respective regions partitioned by a strip-like P-type element isolation well 303 having a closed shape (for example, a rectangular annular shape) in a plan view.

The second high-side transistor QH2 includes an N-type buried layer (B/L) 301A, an N-type epitaxial layer 301B, N-type well regions 301C, a P-type well region 301D, a P-type LDD layer (MVPLDD) 301E, a P-type source region 301F, a P-type drain region 301G, and a gate part 301H.

The N-type epitaxial layer 301B is formed on the P-type semiconductor substrate 350. The buried layer 301A is formed so as to straddle a boundary between the N-type epitaxial layer 301B and the P-type semiconductor substrate 350.

The element isolation well 303 is formed so as to surround the N-type epitaxial layer 301B. The element isolation well 303 has a two-layer structure including a P-type well region 303A disposed on an upper side and a P-type low isolation (L/I) region 303B disposed on a lower side.

The two N-type well regions 301C and the P-type well region 301D are arranged side by side at intervals in a lateral direction and are formed on the surface of the N-type epitaxial layer 301B. The P-type well region 301D is disposed so as to be laterally sandwiched by the two N-type well regions 301C.

The P-type LDD layer 301E is formed on surfaces of the N-type well regions 301C. The P-type source region 301F is formed on a surface of the P-type LDD layer 301E. The P-type source region 301F is electrically connected to the power supply terminal VS. That is, the power supply voltage Vs is applied to the P-type source region 301F.

The P-type drain region 301G is formed on a surface of the P-type well region 301D. The P-type drain region 301G is electrically connected to the output terminal OUT2.

A field insulating film 304 is disposed on the surface of the P-type well region 301D, and an inner edge thereof is disposed on an outer edge of the P-type drain region 301G.

The gate part 301H has a gate insulating film and a gate electrode that covers the gate insulating film from above. The gate insulating film is disposed on the surface of the N-type epitaxial layer 301B so as to straddle from the N-type well regions 301C to the P-type well region 301D. The gate electrode covers the entire gate insulating film and a portion of the field insulating film 304.

The first low-side transistor QL1 includes an N-type buried layer (B/L) 302A, an N-type epitaxial layer 302B, N-type well regions 302C, a P-type well region 302D, an N-type source region 302E, an N-type LDD layer (MVNLDD) 302F, an N-type drain region 302G, and a gate part 302H.

The N-type epitaxial layer 302B is formed on the P-type semiconductor substrate 350. The buried layer 302A is formed so as to straddle a boundary between the N-type epitaxial layer 302B and the P-type semiconductor substrate 350.

The element isolation well 303 is formed so as to surround the N-type epitaxial layer 302B.

The two N-type well regions 302C and the P-type well region 302D are arranged side by side at intervals in the lateral direction and are formed on the surface of the N-type epitaxial layer 302B. The P-type well region 302D is disposed so as to be laterally sandwiched by the two N-type well regions 302C.

The N-type source region 302E is formed on surfaces of the N-type well regions 302C. The N-type source region 302E is electrically connected to the application terminal of the ground potential.

The N-type LDD layer 302F is formed on a surface of the P-type well region 302D. The N-type drain region 302G is formed on a surface of the N-type LDD layer 302F. The N-type drain region 302G is electrically connected to the output terminal OUT1.

A field insulating film 305 is disposed on the surfaces of the N-type well regions 302C, and an outer edge thereof is disposed on an inner edge of the N-type source region 302E.

The gate part 302H has a gate insulating film and a gate electrode that covers the gate insulating film from above. The gate insulating film is disposed on the surface of the N-type epitaxial layer 302B so as to straddle from the N-type well regions 302C to the P-type well region 302D. The gate electrode covers the entire gate insulating film and a portion of the field insulating film 305.

Here, the vertical structure shown in FIG. 4 is accompanied by a parasitic PNP transistor PT1 having the P-type well region 301D as an emitter, the N-type epitaxial layer 301B as a base, and the P-type semiconductor substrate 350 as a collector. Further, the vertical structure shown in FIG. 4 is accompanied by a parasitic NPN transistor PT2 having the N-type epitaxial layer 301B as a collector, the P-type semiconductor substrate 350 as a base, and the N-type epitaxial layer 302B as an emitter.

In the braking operation state shown in FIG. 3B described above, the voltage of the output terminal OUT2 (node N2) applied to the P-type drain region 301G becomes a positive voltage (=Vs+Vf) which is obtained by adding a forward voltage Vf of the upper parasitic diode DH2 to the power supply voltage Vs. Further, the power supply voltage Vs is applied to the N-type epitaxial layer 301B. As a result, a base current flows through the parasitic PNP transistor PT1 to make the parasitic PNP transistor PT1 active.

In addition, in the case described above, the voltage of the output terminal OUT1 (node N1) applied to the N-type drain region 302G becomes a negative voltage (=GND−Vf) which is obtained by subtracting only a forward voltage of the lower parasitic diode DL1 from the ground potential. Further, the ground potential is applied to the P-type semiconductor substrate 350. As a result, a base current flows through the parasitic NPN transistor PT2 to make the parasitic NPN transistor PT2 active.

That is, in the braking operation state shown in FIG. 3B, not only a regenerative current flows in a current path leading to the application terminal of the power supply voltage Vs via the upper parasitic diode DH2, but also a sub-leakage current flows in a current path leading to the P-type semiconductor substrate 350 via the parasitic PNP transistor PT1. Since this sub-leakage current increases the base current of the parasitic NPN transistor PT2, the parasitic NPN transistor PT2 draws a larger amount of current from the base of the parasitic PNP transistor PT1. As a result, the base potential of the parasitic PNP transistor PT1 is further reduced, so that the parasitic PNP transistor PT1 draws in a larger amount of sub-leakage current.

With the series of operations described above, when a latch-up structure is formed by the parasitic transistors PT1 and PT2, a problem occurs due to a large amount of current flowing between the collector and the emitter of the parasitic NPN transistor PT2.

In addition, in the braking operation state shown in FIG. 3D, the latch-up structure is formed by the parasitic transistors PT1 and PT2 associated with the vertical structure of the first high-side transistor QH1 and the second low-side transistor QL2, and the same problem as described above occurs.

FIRST COMPARATIVE EXAMPLE

Here, a first comparative example for comparison with the embodiment of the present disclosure to be described later will be described. Hereinafter, in the drawings, an X direction is shown as a first direction, with one side of the first direction being shown as X1 and the other side of the first direction being shown as X2. A Y direction is shown as a second direction, with one side of the second direction being shown as Y1 and the other side of the second direction being shown as Y2. The first direction and the second direction are orthogonal to each other. Further, a direction orthogonal to the first direction and the second direction is a vertical direction.

Figure 5A:
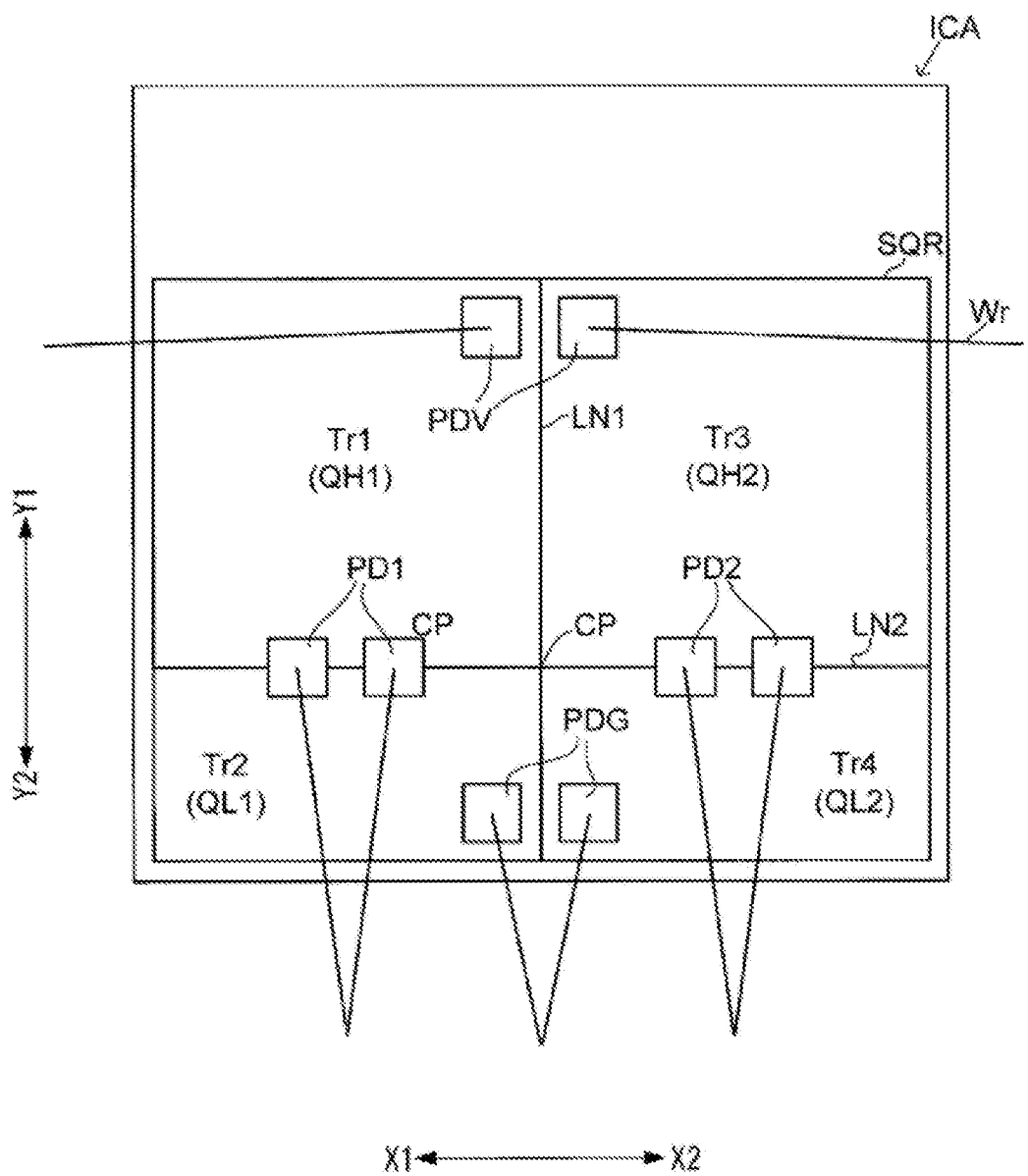
FIG. 5A is a plan view showing a transistor arrangement region in a semiconductor integrated circuit according to a first comparative example.

FIG. 5A is a plan view showing an arrangement region of transistors QH1, QH2, QL1, and QL2 in a semiconductor integrated circuit ICA. FIG. 5A also shows various pads (power supply pads PDV, etc.) arranged in a layer above the transistors. Details of the pads will be described later.

Further, for the sake of convenience, the semiconductor integrated circuit ICA shown in FIG. 5A is simply shown as a size capable of integrating the transistors QH1, QH2, QL1, and QL2, and the size of the semiconductor integrated circuit 1001 shown in FIG. 2 is larger than the size of the semiconductor integrated circuit ICA shown in FIG. 5A.

The first high-side transistor QH1 is disposed in a first transistor arrangement region Tr1 formed in a square shape having sides extending in the first direction and the second direction, respectively, in a plan view. The first low-side transistor QL1 is disposed in a second transistor arrangement region Tr2 formed in a square shape having sides extending in the first direction and the second direction, respectively, in a plan view. The second high-side transistor QH2 is disposed in a third transistor arrangement region Tr3 formed in a square shape having sides extending in the first direction and the second direction, respectively, in a plan view. The second low-side transistor QL2 is disposed in a fourth transistor arrangement region Tr4 formed in a square shape having sides extending in the first direction and the second direction, respectively, in a plan view.

The first to fourth transistor arrangement regions Tr1 to Tr4 correspond to regions obtained by dividing a square region SQR formed in a square shape having sides extending in the first direction and the second direction, respectively, in a plan view, into four regions by a first straight line LN1, which connects, in the second direction, a side extending in the first direction on one side of the second direction in the square region SQR and a side extending in the first direction on the other side of the second direction in the square region SQR, and a second straight line LN2, which connects, in the first direction, a side extending in the second direction on one side of the first direction in the square region SQR and a side extending in the second direction on the other side of the first direction in the square region SQR.

The first transistor arrangement region Tr1 is located on the one side of the first direction and the one side of the second direction, the second transistor arrangement region Tr2 is located on the one side of the first direction and on the other side of the second direction, the third transistor arrangement region Tr3 is located on the other side of the first direction and the one side of the second direction, and the fourth transistor arrangement region Tr4 is located on the other side of the first direction and the other side of the second direction.

An area S2 of the second transistor arrangement region Tr2 in a plan view is half of an area S1 of the first transistor arrangement region Tr1 in a plan view. That is, S1:S2 is 2:1. An area S4 of the fourth transistor arrangement region Tr4 in a plan view is half of an area S3 of the third transistor arrangement region Tr3 in a plan view. That is, S3:S4=2:1. Here, since S1=S3, S2=S4.

The reason that the areas S1 and S3 of the first and third transistor arrangement regions Tr1 and Tr3 are twice as large as the areas S2 and S4 of the second and fourth transistor arrangement regions Tr2 and Tr4, respectively, is that on-resistance values of the high-side transistors QH1 and QH2, which are PDMOS, and on-resistance values of the low-side transistors QL1 and QL2, which are NDMOS, are brought close to each other.

Figure 5B:
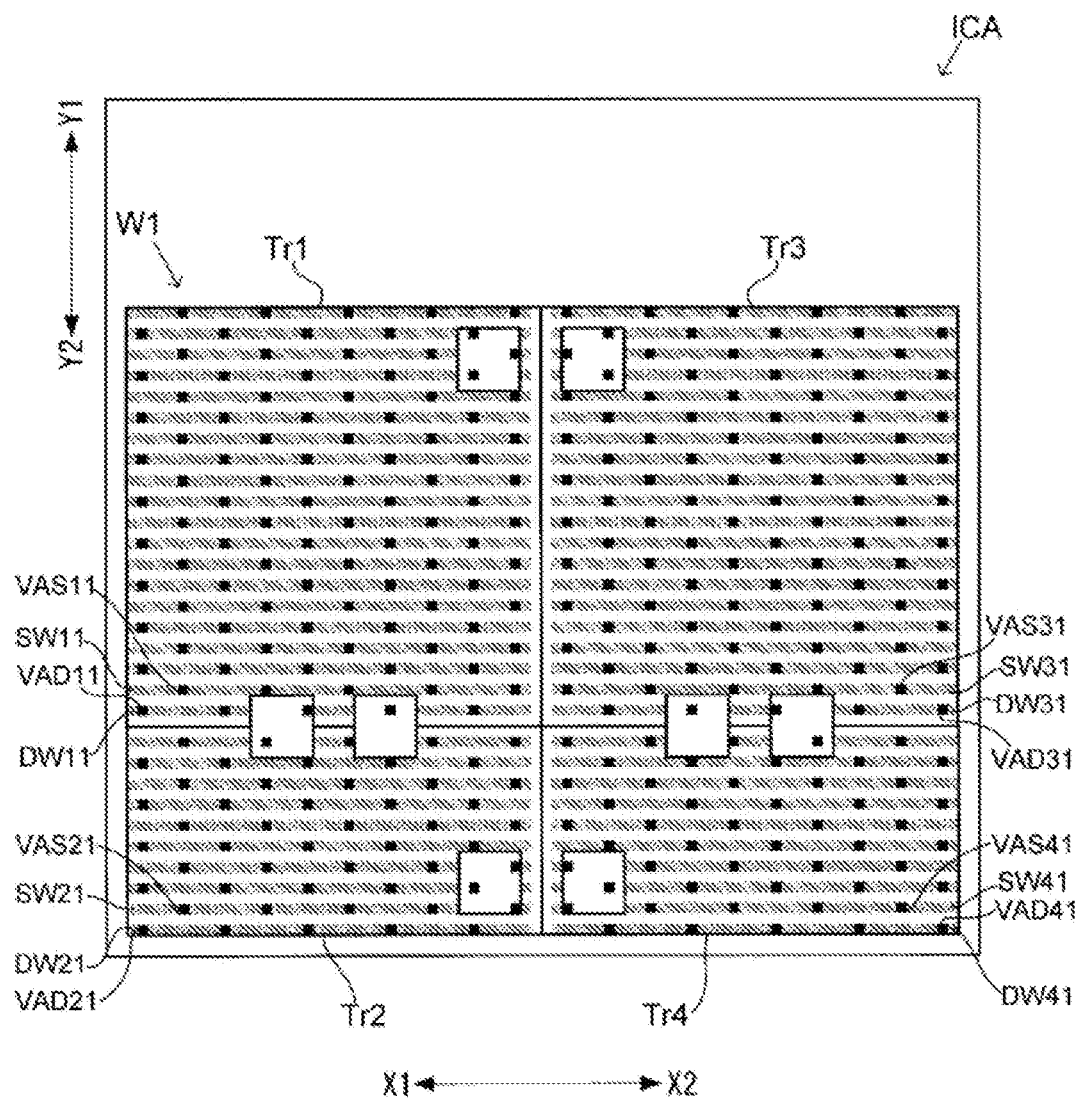
FIG. 5B is a plan view showing a lower layer wiring portion in the semiconductor integrated circuit according to the first comparative example.

FIG. 5B is a plan view of a lower layer wiring portion W1, which is disposed in a layer above the transistors arranged in the respective transistor arrangement regions Tr1 to Tr4 shown in FIG. 5A, in the semiconductor integrated circuit ICA. FIG. 5B also shows the transistor arrangement regions Tr1 to T4 and various pads (power supply pads PDV, etc.) together. Further, the lower layer wiring portion W1 is disposed in a layer below a middle layer wiring portion W2 and an upper layer wiring portion W3, which will be described later.

As shown in FIG. 5B, the lower layer wiring portion W1 has a plurality of first drain lower layer wirings DW11 and a plurality of first source lower layer wirings SW11 in the first transistor arrangement region Tr1. The first drain lower layer wirings DW11 and the first source lower layer wirings SW11 are formed so as to extend in the first direction. The first drain lower layer wirings DW11 and the first source lower layer wirings SW11 are arranged alternately side by side in the second direction. In FIG. 5B, the first drain lower layer wiring DW11 is arranged at an end of the first transistor arrangement region Tr1 on the other side of the second direction.

Here, in the first transistor arrangement region Tr1, drain regions extending in the first direction are located at positions vertically facing the first drain lower layer wirings DW11, and source regions extending in the first direction are located at positions vertically facing the first source lower layer wirings SW11. That is, the drain regions and the source regions of the high-side transistor QH1 are located alternately side by side in the second direction. The drain regions correspond to the P-type drain region 301G in FIG. 4, and the source regions correspond to the P-type source region 301F in FIG. 4. That is, in the first transistor arrangement region Tr1, the vertical structure of the high-side transistor QH1 shown in FIG. 4 as a unit structure is repeated in the horizontal direction. The drain regions in the first transistor arrangement region Tr1 are electrically connected to the first drain lower layer wirings DW11, and the source regions in the first transistor arrangement region Tr1 are electrically connected to the first source lower layer wirings SW11.

Further, as shown in FIG. 5B, the lower layer wiring portion W1 has a plurality of second drain lower layer wirings DW21 and a plurality of second source lower layer wirings SW21 in the second transistor arrangement region Tr2. The second drain lower layer wirings DW21 and the second source lower layer wirings SW21 are formed so as to extend in the first direction. The second drain lower layer wirings DW21 and the second source lower layer wirings SW21 are arranged alternately side by side in the second direction. In FIG. 5B, the second drain lower layer wiring DW21 is arranged at an end of the second transistor arrangement region Tr2 on the other side of the second direction.

Here, in the second transistor arrangement region Tr2, drain regions extending in the first direction are located at positions vertically facing the second drain lower layer wirings DW21, and source regions extending in the first direction are located at positions vertically facing the second source lower layer wirings SW21. That is, the drain regions and the source regions of the first low-side transistor QL1 are located alternately side by side in the second direction. The drain regions correspond to the N-type drain region 302G in FIG. 4, and the source regions correspond to the N-type source region 302E in FIG. 4. That is, in the second transistor arrangement region Tr2, the vertical structure of the low-side transistor QL1 shown in FIG. 4 as a unit structure is repeated in the horizontal direction. The drain regions in the second transistor arrangement region Tr2 are electrically connected to the second drain lower layer wirings DW21, and the source regions in the second transistor arrangement region Tr2 are electrically connected to the second source lower layer wirings SW21.

Further, as shown in FIG. 5B, the lower layer wiring portion W1 has a plurality of third drain lower layer wirings DW31 and a plurality of third source lower layer wirings SW31 in the third transistor arrangement region Tr3. The third drain lower layer wirings DW31 and the third source lower layer wirings SW31 are formed so as to extend in the first direction. The third drain lower layer wirings DW31 and the third source lower layer wirings SW31 are arranged alternately side by side in the second direction. In FIG. 5B, the third drain lower layer wiring DW31 is arranged at an end of the third transistor arrangement region Tr3 on the other side of the second direction.

Here, in the third transistor arrangement region Tr3, drain regions extending in the first direction are located at positions vertically facing the third drain lower layer wirings DW31, and source region extending in the first direction are located in positions vertically facing the third source lower layer wirings SW31. That is, the drain regions and the source regions of the second high-side transistor QH2 are located alternately side by side in the second direction. The drain regions correspond to the P-type drain region 301G in FIG. 4, and the source regions correspond to the P-type source region 301F in FIG. 4. That is, in the third transistor arrangement region Tr3, the vertical structure of the high-side transistor QH2 shown in FIG. 4 as a unit structure is repeated in the horizontal direction. The drain regions in the third transistor arrangement region Tr3 are electrically connected to the third drain lower layer wirings DW31, and the source regions in the third transistor arrangement region Tr3 are electrically connected to the third source lower layer wirings SW31.

Further, as shown in FIG. 5B, the lower layer wiring portion W1 has a plurality of fourth drain lower layer wirings DW41 and a plurality of fourth source lower layer wirings SW41 in the fourth transistor arrangement region Tr4. The fourth drain lower layer wirings DW41 and the fourth source lower layer wirings SW41 are formed so as to extend in the first direction. The fourth drain lower layer wirings DW41 and the fourth source lower layer wirings SW41 are arranged alternately side by side in the second direction. In FIG. 5B, the fourth drain lower layer wiring DW41 is arranged at an end on the fourth transistor arrangement region Tr4 on the other side of the second direction.

Here, in the fourth transistor arrangement region Tr4, drain regions extending in the first direction are located at positions vertically facing the fourth drain lower layer wirings DW41, and source regions extending in the first direction are located at positions vertically facing the fourth source lower layer wirings SW41. That is, the drain regions and the source regions of the second low-side transistor QL2 are located alternately side by side in the second direction. The drain regions correspond to the N-type drain region 302G in FIG. 4, and the source regions correspond to the N-type source region 302E in FIG. 4. That is, in the fourth transistor arrangement region Tr4, the vertical structure of the low-side transistor QL2 shown in FIG. 4 as a unit structure is repeated in the horizontal direction. The drain regions in the fourth transistor arrangement region Tr4 are electrically connected to the fourth drain lower layer wirings DW41, and the source regions in the fourth transistor arrangement region Tr4 are electrically connected to the fourth source lower layer wirings SW41.

Figure 5C:
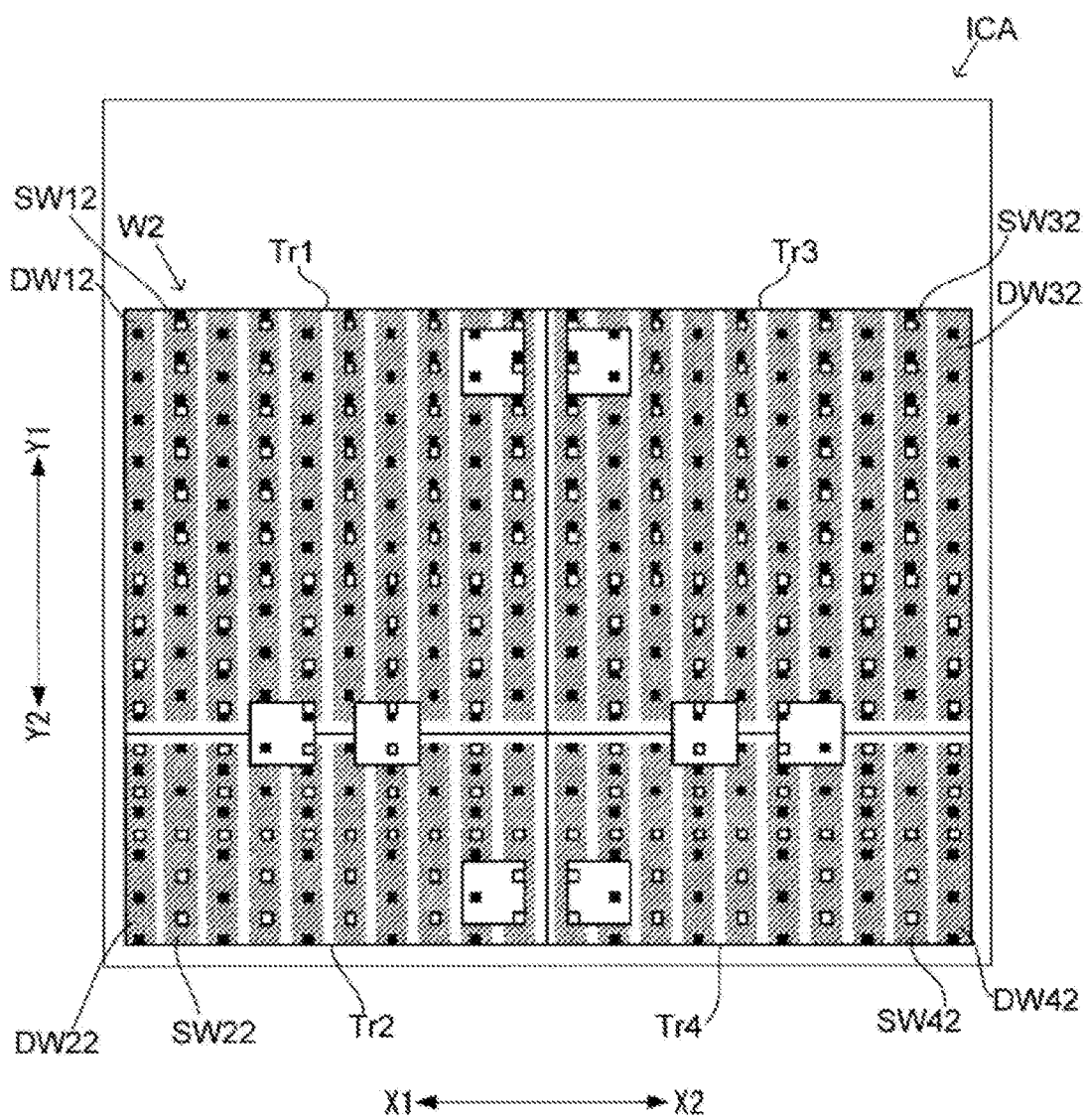
FIG. 5C is a plan view showing a middle layer wiring portion in the semiconductor integrated circuit according to the first comparative example.

FIG. 5C is a plan view of the middle layer wiring portion W2, which is disposed in a layer above the lower layer wiring portion W1 shown in FIG. 5B, in the semiconductor integrated circuit ICA. FIG. 5C also shows the transistor arrangement regions Tr1 to T4 and various pads (power supply pads PDV, etc.).

As shown in FIG. 5C, the middle layer wiring portion W2 has a plurality of first drain middle layer wirings DW12 and a plurality of first source middle layer wirings SW12 in the first transistor arrangement region Tr1. The first drain middle layer wirings DW12 and the first source middle layer wirings SW12 are formed so as to extend in the second direction. The first drain middle layer wirings DW12 and the first source middle layer wirings SW12 are arranged alternately side by side in the first direction. In FIG. 5C, the first drain middle layer wiring DW12 is arranged at an end of the first transistor arrangement region Tr1 on the one side of the first direction.

As shown in FIGS. 5B and 5C, first drain lower side vias VAD11 (black squares) are arranged at positions where the first drain middle layer wirings DW12 and the first drain lower layer wirings DW11 overlap each other in a plan view. The first drain lower side vias VAD11 electrically connect the first drain middle layer wirings DW12 and the first drain lower layer wirings DW11. The vias are hole portions extending vertically with inner wall surfaces thereof plated with a conductor (Cu or the like). Further, the inside of the vias may be filled with a conductor. That is, the vias may be hole portions in which a conductor is provided.

As shown in FIGS. 5B and 5C, first source lower side vias VAS11 (black squares) are arranged at positions where the first source middle layer wirings SW12 and the first source lower layer wirings SW11 overlap each other in a plan view. The first source lower side vias VAS11 electrically connect the first source middle layer wirings SW12 and the first source lower layer wirings SW11.

As a result, the first drain lower side vias VAD11 and the first source lower side vias VAS11 are arranged in a zigzag manner in a plan view.

Further, as shown in FIGS. 5B and 5C, second drain lower side vias VAD21 (black squares) are arranged at positions where the second drain middle layer wirings DW22 and the second drain lower layer wirings DW21 overlap each other in a plan view. The second drain lower side vias VAD21 electrically connect the second drain middle layer wirings DW22 and the second drain lower layer wirings DW21.

As shown in FIGS. 5B and 5C, second source lower side vias VAS21 (black squares) are arranged at positions where the second source middle layer wirings SW22 and the second source lower layer wirings SW21 overlap each other in a plan view. The second source lower side vias VAS21 electrically connect the second source middle layer wirings SW22 and the second source lower layer wirings SW21.

As a result, the second drain lower side vias VAD21 and the second source lower side vias VAS21 are arranged in a zigzag manner in a plan view.

Further, as shown in FIGS. 5B and 5C, third drain lower side vias VAD31 (black squares) are arranged at positions where third drain middle layer wirings DW32 and the third drain lower layer wirings DW31 overlap each other in a plan view. The third drain lower side vias VAD31 electrically connect the third drain middle layer wirings DW32 and the third drain lower layer wirings DW31.

As shown in FIGS. 5B and 5C, third source lower side vias VAS31 (black squares) are arranged at positions where the third source middle layer wirings SW32 and the third source lower layer wirings SW31 overlap each other in a plan view. The third source lower side vias VAS31 electrically connect the third source middle layer wirings SW32 and the third source lower layer wirings SW31.

As a result, the third drain lower side vias VAD31 and the third source lower side vias VAS31 are arranged in a zigzag manner in a plan view.

Further, as shown in FIGS. 5B and 5C, fourth drain lower side vias VAD41 (black squares) are arranged at positions where the fourth drain middle layer wirings DW42 and the fourth drain lower layer wirings DW41 overlap each other in a plan view. The fourth drain lower side vias VAD41 electrically connect the fourth drain middle layer wirings DW42 and the fourth drain lower layer wirings DW41.

As shown in FIGS. 5B and 5C, fourth source lower side vias VAS41 (black squares) are arranged at positions where the fourth source middle layer wirings SW42 and the fourth source lower layer wirings SW41 overlap each other in a plan view. The fourth source lower side vias VAS41 electrically connect the fourth source middle layer wirings SW42 and the fourth source lower layer wirings SW41.

As a result, the fourth drain lower side vias VAD41 and the fourth source lower side vias VAS41 are arranged in a zigzag manner in a plan view.

Figure 5D:
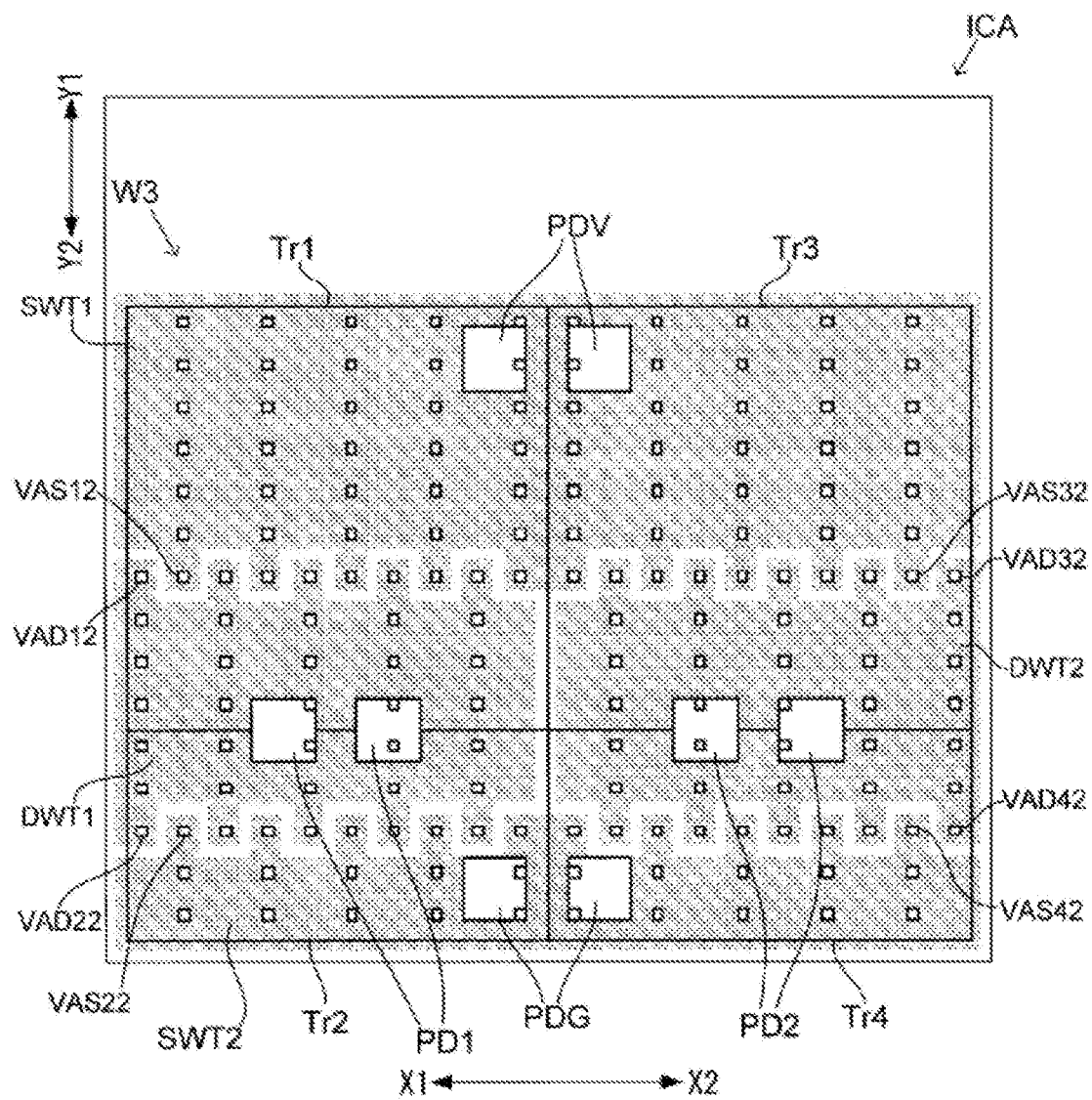
FIG. 5D is a plan view showing an upper layer wiring portion in the semiconductor integrated circuit according to the first comparative example.

FIG. 5D is a plan view of the upper layer wiring portion W3, which is disposed in a layer above the middle layer wiring portion W2 shown in FIG. 5C, in the semiconductor integrated circuit ICA. FIG. 5D also shows the transistor arrangement regions Tr1 to T4 and various pads (power supply pads PDV, etc.).

As shown in FIG. 5D, the upper layer wiring portion W3 includes a first source upper layer wiring SWT1, a second source upper layer wiring SWT2, a first drain upper layer wiring DWT1, and a second drain upper layer wiring DWT2.

The first source upper layer wiring SWT1 is formed so as to overlap the first transistor arrangement region Tr1 and the third transistor arrangement region Tr3 in a plan view and extend in the first direction.

The first drain upper layer wiring DWT1 and the second drain upper layer wiring DWT2 are arranged side by side in the first direction on the other side of the first source upper layer wiring SWT1 in the second direction. The first drain upper layer wiring DWT1 is formed so as to overlap the first transistor arrangement region Tr1 and the second transistor arrangement region Tr2 in a plan view and extend in the first direction. The second drain upper layer wiring DWT2 is arranged on the other side of the first drain upper layer wiring DWT1 in the first direction. The second drain upper layer wiring DWT2 is formed so as to overlap the third transistor arrangement region Tr3 and the fourth transistor arrangement region Tr4 in a plan view and extend in the first direction.

The second source upper layer wiring SWT2 is formed so as to overlap the second transistor arrangement region Tr2 and the fourth transistor arrangement region Tr4 in a plan view and extend in the first direction. The second source upper layer wiring SWT2 is arranged on the other side of the first drain upper layer wiring DWT1 and the second drain upper layer wiring DWT2 in the second direction.

As shown in FIGS. 5C and 5D, first source upper side vias VAS12 (white squares) are arranged at positions where the first source upper layer wiring SWT1 and the first source middle layer wirings SW12 overlap each other in a plan view. The first source upper side vias VAS12 electrically connect the first source upper layer wiring SWT1 and the first source middle layer wirings SW12.

As shown in FIGS. 5C and 5D, third source upper side vias VAS32 (white squares) are arranged at positions where the first source upper layer wiring SWT1 and the third source middle layer wirings SW32 overlap each other in a plan view. The third source upper side vias VAS32 electrically connect the first source upper layer wiring SWT1 and the third source middle layer wirings SW32.

As shown in FIG. 5D, two power supply pads PDV are formed as a portion of the first source upper layer wiring SWT1. The power supply pads PDV are arranged in a vicinity of a boundary between the first transistor arrangement region Tr1 and the third transistor arrangement region Tr3 in a plan view so as to sandwich the boundary from both sides in the first direction, and are arranged at ends of the first transistor arrangement region Tr1 and the third transistor arrangement region Tr3 on the one side in the second direction.

As a result, the power supply pads PDV are electrically connected to the source region of the first high-side transistor QH1 disposed in the first transistor arrangement region Tr1 and the source region of the second high-side transistor QH2 disposed in the third transistor arrangement region Tr3. The power supply pads PDV are connected to the power supply terminal VS to which the power supply voltage Vs is applied, by wires Wr, as shown in FIG. 5A.

Further, as shown in FIGS. 5C and 5D, first drain upper side vias VAD12 (white squares) are arranged at positions where the first drain upper layer wiring DWT1 and the first drain middle layer wirings DW12 overlap each other in a plan view. The first drain upper side vias VAD12 electrically connect the first drain upper layer wiring DWT1 and the first drain middle layer wirings DW12.

As shown in FIGS. 5C and 5D, second drain upper side vias VAD22 (white squares) are arranged at positions where the first drain upper layer wiring DWT1 and the second drain middle layer wirings DW22 overlap each other in a plan view. The second drain upper side vias VAD22 electrically connect the first drain upper layer wiring DWT1 and the second drain middle layer wirings DW22.

As shown in FIG. 5D, two first output pads PD1 are formed as a portion of the first drain upper layer wiring DWT1. The first output pads PD1 are arranged side by side in the first direction on a boundary between the first transistor arrangement region Tr1 and the second transistor arrangement region Tr2 in a plan view. Further, the first output pads PD1 are arranged in a vicinity of a center position of the first transistor arrangement region Tr1 and the second transistor arrangement region Tr2 in the first direction.

As a result, the first output pads PD1 are electrically connected to the drain region of the first high-side transistor QH1 disposed in the first transistor arrangement region Tr1 and the drain region of the first low-side transistor QL1 disposed in the second transistor arrangement region Tr2. The first output pads PD1 are connected to the output terminal OUT1 by the wires Wr, as shown in FIG. 5A.

Further, as shown in FIGS. 5C and 5D, third drain upper side vias VAD32 (white squares) are arranged at positions where the second drain upper layer wiring DWT2 and the third drain middle layer wirings DW32 overlap each other in a plan view. The third drain upper side vias VAD32 electrically connect the second drain upper layer wiring DWT2 and the third drain middle layer wirings DW32.

As shown in FIGS. 5C and 5D, fourth drain upper side vias VAD42 (white squares) are arranged at positions where the second drain upper layer wiring DWT2 and the fourth drain middle layer wirings DW42 overlap each other in a plan view. The fourth drain upper side vias VAD42 electrically connect the second drain upper layer wiring DWT2 and the fourth drain middle layer wirings DW42.

As shown in FIG. 5D, two second output pads PD2 are formed as a portion of the second drain upper layer wiring DWT2. The second output pads PD2 are arranged side by side in the first direction on a boundary between the third transistor arrangement region Tr3 and the fourth transistor arrangement region Tr4 in a plan view. Further, the second output pads PD2 are arranged in a vicinity of a center position of the third transistor arrangement region Tr3 and the fourth transistor arrangement region Tr4 in the first direction.

As a result, the second output pads PD2 are electrically connected to the drain region of the second high-side transistor QH2 disposed in the third transistor arrangement region Tr3 and the drain region of the second low-side transistor QL2 disposed in the fourth transistor arrangement region Tr4. The second output pads PD2 are connected to the output terminal OUT2 by the wires Wr, as shown in FIG. 5A.

As shown in FIGS. 5C and 5D, second source upper side vias VAS22 (white squares) are arranged at positions where the second source upper layer wiring SWT2 and the second source middle layer wirings SW22 overlap each other in a plan view. The second source upper side vias VAS 22 electrically connect the second source upper layer wiring SWT2 and the second source middle layer wirings SW22.

As shown in FIGS. 5C and 5D, fourth source upper side vias VAS42 (white squares) are arranged at positions where the second source upper layer wiring SWT2 and the fourth source middle layer wirings SW42 overlap each other in a plan view. The fourth source upper side vias VAS42 electrically connect the second source upper layer wiring SWT2 and the fourth source middle layer wirings SW42.

As shown in FIG. 5D, two ground pads PDG are formed as a portion of the second source upper layer wiring SWT2. The ground pads PDG are arranged in a vicinity of a boundary between the second transistor arrangement region Tr2 and the fourth transistor arrangement region Tr4 in a plan view so as to sandwich the boundary from both sides in the first direction, and are arranged at ends of the second transistor arrangement region Tr2 and the fourth transistor arrangement region Tr4 on the other side in the second direction.

As a result, the ground pads PDG are electrically connected to the source region of the first low-side transistor QL1 disposed in the second transistor arrangement region Tr2 and the source region of the second low-side transistor QL2 disposed in the fourth transistor arrangement region Tr4. The ground pads PDG are connected to the ground terminal GND to which the ground potential is applied, by the wires Wr, as shown in FIG. 5A.

Problems of First Comparative Example, and Second Comparative Example

In the first comparative example described above, as shown in FIG. 5A, the second transistor arrangement region Tr2 and the third transistor arrangement region Tr3 are in contact with each other at an intersection CP where the first straight line LN1 and the second straight line LN2 intersect with each other. That is, a distance (hereinafter referred to as the shortest distance) between the second transistor arrangement region Tr2 and the third transistor arrangement region Tr3 becomes zero.

As a result, in the braking operation state as shown in FIG. 3B, in the latch-up structure formed by the high-side transistor QH2 and the low-side transistor QL1 as described above with reference to FIG. 4, hFE of the parasitic NPN transistor PT2 increases, and a current flowing between the collector and the emitter of the parasitic NPN transistor PT2 increases.

Further, as shown in FIG. 5A, the first transistor arrangement region Tr1 and the fourth transistor arrangement region Tr4 are in contact with each other at the intersection CP. That is, a distance between the first transistor arrangement region Tr1 and the fourth transistor arrangement region Tr4 becomes zero.

As a result, in the braking operation state as shown in FIG. 3D, in the latch-up structure formed by the high-side transistor QH1 and the low-side transistor QL2, hFE of the parasitic NPN transistor PT2 increases, and a current flowing between the collector and the emitter of the parasitic NPN transistor PT2 increases.

Figure 6:
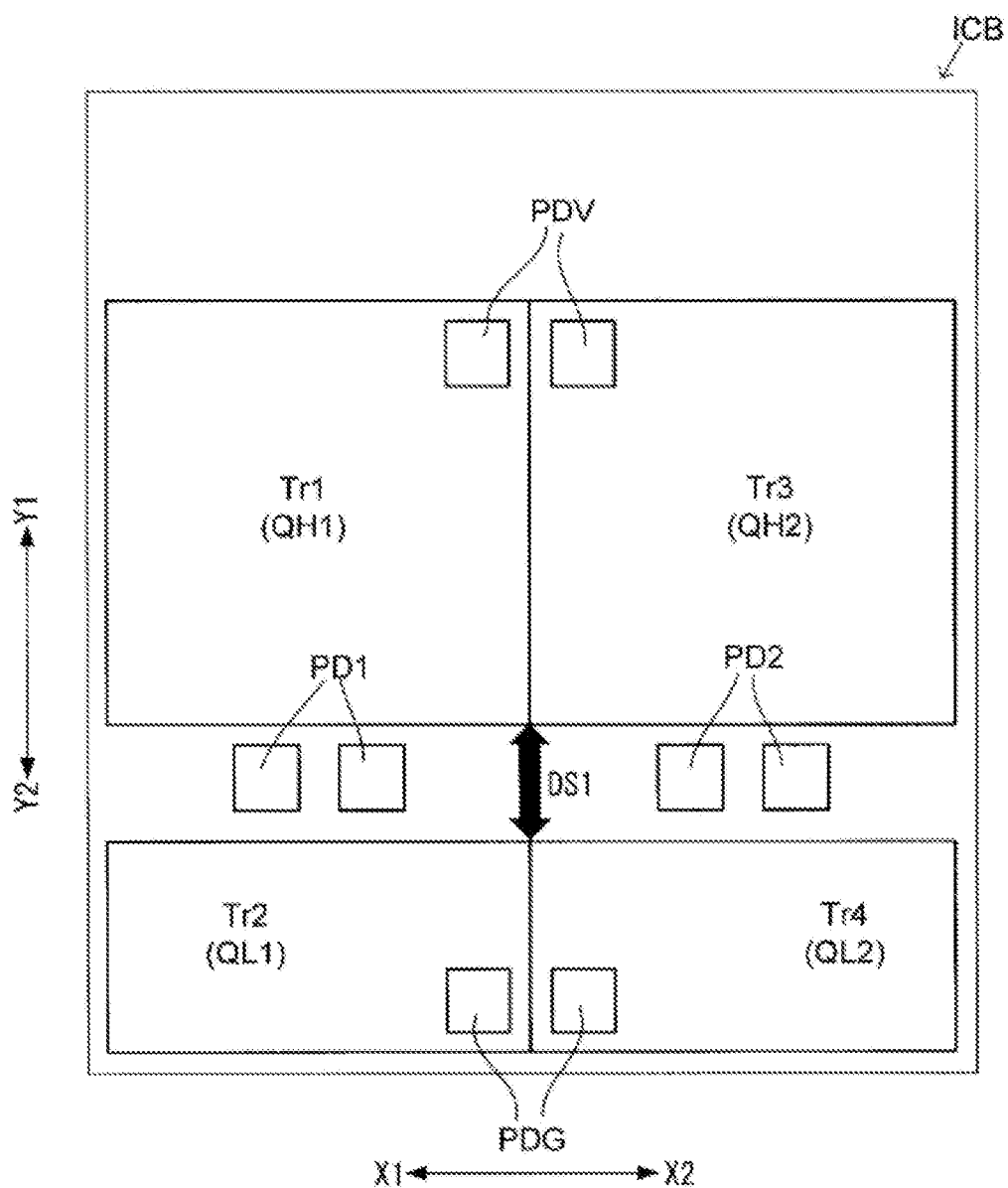
FIG. 6 is a plan view showing a transistor arrangement region in a semiconductor integrated circuit according to a second comparative example.

Therefore, in a semiconductor integrated circuit ICB according to a second comparative example as shown in FIG. 6, a set consisting of the second transistor arrangement region Tr2 and the fourth transistor arrangement region Tr4 is separated from a set consisting of the first transistor arrangement region Tr1 and the third transistor arrangement region Tr3 by a distance DS1 in the second direction.

As a result, a distance between the second transistor arrangement region Tr2 and the third transistor arrangement region Tr3 and a distance between the first transistor arrangement region Tr1 and the fourth transistor arrangement region Tr4 can be set to be longer than those of the first comparative example. Therefore, the hFE of the parasitic NPN transistor PT2 in the latch-up structure as described above can be reduced, and the current flowing between the collector and the emitter of the parasitic NPN transistor PT2 can be suppressed.

However, in the semiconductor integrated circuit ICB according to the second comparative example as described above, there arises a problem that a circuit area (chip area) increases. In view of such circumstances, an embodiment of the present disclosure to be described below has been devised.

<Layout of Transistor Arrangement Region>

Figure 7A:
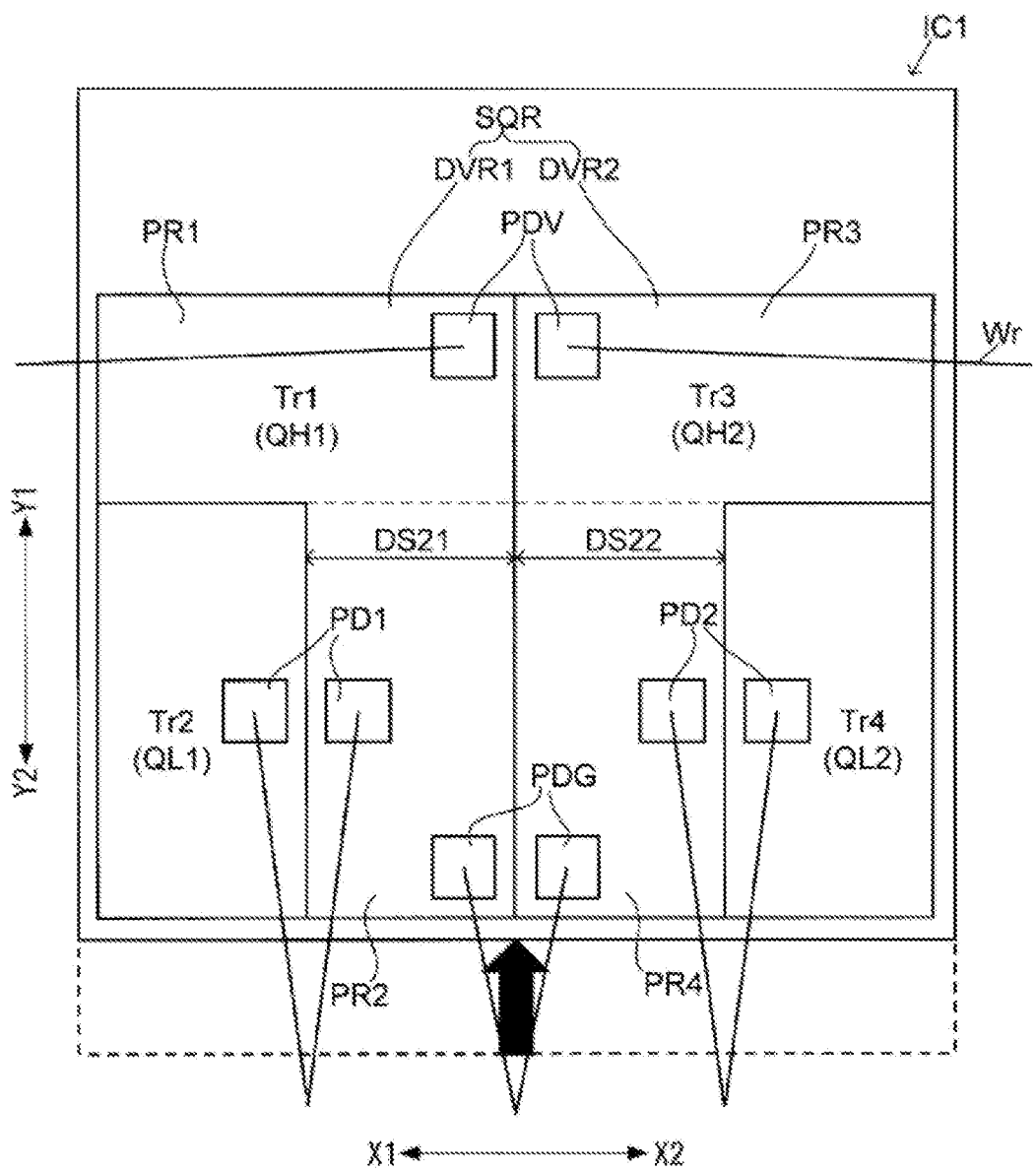
FIG. 7A is a plan view showing a transistor arrangement region in a semiconductor integrated circuit according to an exemplary embodiment of the present disclosure.

FIG. 7A is a plan view showing an arrangement region of transistors QH1, QH2, QL1, and QL2 in a semiconductor integrated circuit IC1 according to an exemplary embodiment of the present disclosure. FIG. 7A also shows various pads (power supply pads PDV, etc.) arranged in a layer above the transistors. Details of the pads will be described later.

In the semiconductor integrated circuit IC1 shown in FIG. 7A, as a change from the first comparative example shown in FIG. 5A, in a region including the first transistor arrangement region Tr1 and the second transistor arrangement region Tr2 in FIG. 5A, a length of a side extending in the first direction of the second transistor arrangement region Tr2 is halved, and a length of a side extending in the second direction of the second transistor arrangement region Tr2 is doubled, while a position of a corner of the second transistor arrangement region Tr2 on the one side in the first direction and on the other side in the second direction is not changed.

Therefore, in the semiconductor integrated circuit IC1, the area S2 of the second transistor arrangement region Tr2 and the area S1 of the first transistor arrangement region Tr1 are not changed as compared with the first comparative example, and S1:S2=2:1.

Further, in the semiconductor integrated circuit IC1 shown in FIG. 7A, as a change from the first comparative example shown in FIG. 5A, in a region including the third transistor arrangement region Tr3 and the fourth transistor arrangement region Tr4 in FIG. 5A, a length of a side extending in the first direction of the four transistor arrangement region Tr4 is halved, and a length of a side extending in the second direction of the fourth transistor arrangement region Tr4 is doubled, while a position of a corner of the fourth transistor arrangement region Tr4 on the other side in the first direction and on the other side in the second direction is not changed. Therefore, in the semiconductor integrated circuit IC1, the area S4 of the fourth transistor arrangement region Tr4 and the area S3 of the third transistor arrangement region Tr3 are not changed as compared with the first comparative example, and S3:S4=2:1.

To further paraphrase the configuration shown in FIG. 7A, the square region SQR formed into a square shape having sides extending in the first direction and the second direction, respectively, in a plan view is divided into two regions, i.e., a square first division region DVR1 on the one side in the first direction and a square second division region DVR2 on the other side in the first direction. The second transistor arrangement region Tr2 is formed in a square shape having sides extending in the first direction and the second direction, respectively, in a plan view. The corner of the second transistor arrangement region Tr2 on the one side in the first direction and on the other side in the second direction coincides with a corner of the first division region DVR1 on the one side in the first direction and the other side in the second direction. The first transistor arrangement region Tr1 is a region in the first division region DVR1 excluding the second transistor arrangement region Tr2.

Therefore, the first transistor arrangement region Tr1 includes a square first partial region PR1 connected to the one side of the second transistor arrangement region Tr2 in the second direction and extending in the first direction, and a square second partial region PR2 connected to the other side of the second transistor arrangement region Tr2 in the first direction and the other side of the first partial region PR1 in the second direction and extending in the second direction (a broken line in FIG. 7A indicates a boundary between the first partial region PR1 and the second partial region PR2). That is, the first transistor arrangement region Tr1 has an inverted L shape in a plan view.

Further, the fourth transistor arrangement region Tr4 is formed in a square shape having sides extending in the first direction and the second direction, respectively, in a plan view. The corner of the fourth transistor arrangement region Tr4 on the other side in the first direction and on the other side in the second direction coincides with a corner of the second division region DVR2 on the other side in the first direction and on the other side in the second direction. The third transistor arrangement region Tr3 is a region in the second division region DVR2 excluding the fourth transistor arrangement region Tr4.

Therefore, the third transistor arrangement region Tr3 includes a square third partial region PR3 connected to the one side of the fourth transistor arrangement region Tr4 in the second direction and extending in the first direction, and a square fourth partial region PR4 connected to the one side of the fourth transistor arrangement region Tr4 in the first direction and the other side of the third partial region PR3 in the second direction and extending in the second direction (a broken line in FIG. 7A indicates a boundary between the third partial region PR3 and the fourth partial region PR4). That is, the third transistor arrangement region Tr3 has an inverted L shape in a plan view.

As described above, in the present embodiment, the fourth partial region PR4 (at least a portion of the third transistor arrangement region Tr3) is located on the other side of the second transistor arrangement region Tr2 in the first direction. The second partial region PR2 (at least a portion of the first transistor arrangement region Tr1) is sandwiched in the first direction by the second transistor arrangement region Tr2 and the fourth partial region PR4 (at least a portion of the third transistor arrangement region Tr3) and is connected to each of the second transistor arrangement region Tr2 and the fourth partial region PR4 (at least a portion of the third transistor arrangement region Tr3).

As a result, the second transistor arrangement region Tr2 and the third transistor arrangement region Tr3 can be distanced by a distance DS21 corresponding to an amount that allows the first transistor arrangement region Tr1 to be interposed between the regions Tr2 and Tr3. Therefore, in the case of the braking operation state as shown in FIG. 3B, in the latch-up structure formed by the high-side transistor QH2 and the low-side transistor QL1, hFE of the parasitic NPN transistor PT2 can be reduced, and a current flowing between the collector and the emitter of the parasitic NPN transistor PT2 can be suppressed.

Further, in the present embodiment, the second partial region PR2 (at least a portion of the first transistor arrangement region Tr1) is located on the one side of the fourth transistor arrangement region Tr4 in the first direction. The fourth partial region PR4 (at least a portion of the third transistor arrangement region Tr3) is sandwiched in the first direction by the fourth transistor arrangement region Tr4 and the second partial region PR2 (at least a portion of the first transistor arrangement region Tr1) and is connected to each of the fourth transistor arrangement region Tr4 and the second partial region PR2 (at least a portion of the first transistor arrangement region Tr1).

As a result, the fourth transistor arrangement region Tr4 and the first transistor arrangement region Tr1 can be distanced by a distance DS22 corresponding to an amount that allows the third transistor arrangement region Tr3 to be interposed between the regions Tr4 and Tr1. Therefore, in the case of the braking operation state as shown in FIG. 3D, in the latch-up structure formed by the high-side transistor QH1 and the low-side transistor QL2, hFE of the parasitic NPN transistor PT2 can be reduced, and a current flowing between the collector and the emitter of the parasitic NPN transistor PT2 can be suppressed.

Further, in the present embodiment, an area of the region consisting of the first to fourth transistor arrangement regions Tr1 to Tr4 (=an area of the square region SQR) can be maintained as compared with FIG. 5A. That is, it is possible to suppress an increase in the circuit area of the semiconductor integrated circuit IC1. As a result, as indicated by a black arrow in FIG. 7A, the circuit area in the present embodiment can be reduced as compared with the circuit area of the semiconductor integrated circuit ICB in the second comparative example (see FIG. 6).

Further, a length of a side extending in the first direction of the second transistor arrangement region Tr2 is half of a length of a side extending in the first direction of the first division region DVR1. The distance DS21 may be further lengthened by further shortening the length of the side extending in the first direction of the second transistor arrangement region Tr2, but in that case, in order to maintain the area of the second transistor arrangement region Tr2, it is necessary to further increase a length of a side extending in the second direction of the second transistor arrangement region Tr2. In such a case, a distance between an element (not shown) disposed in a region other than the transistor arrangement regions shown in FIG. 7A and the second transistor arrangement region Tr2 in the semiconductor integrated circuit IC1 becomes short, which may be undesirable. Further, the same applies to the fact that a length of a side extending in the first direction of the fourth transistor arrangement region Tr4 is half of a length of a side extending in the first direction of the second division region DVR2.

<Lower Layer Wiring Portion>

Figure 7B:
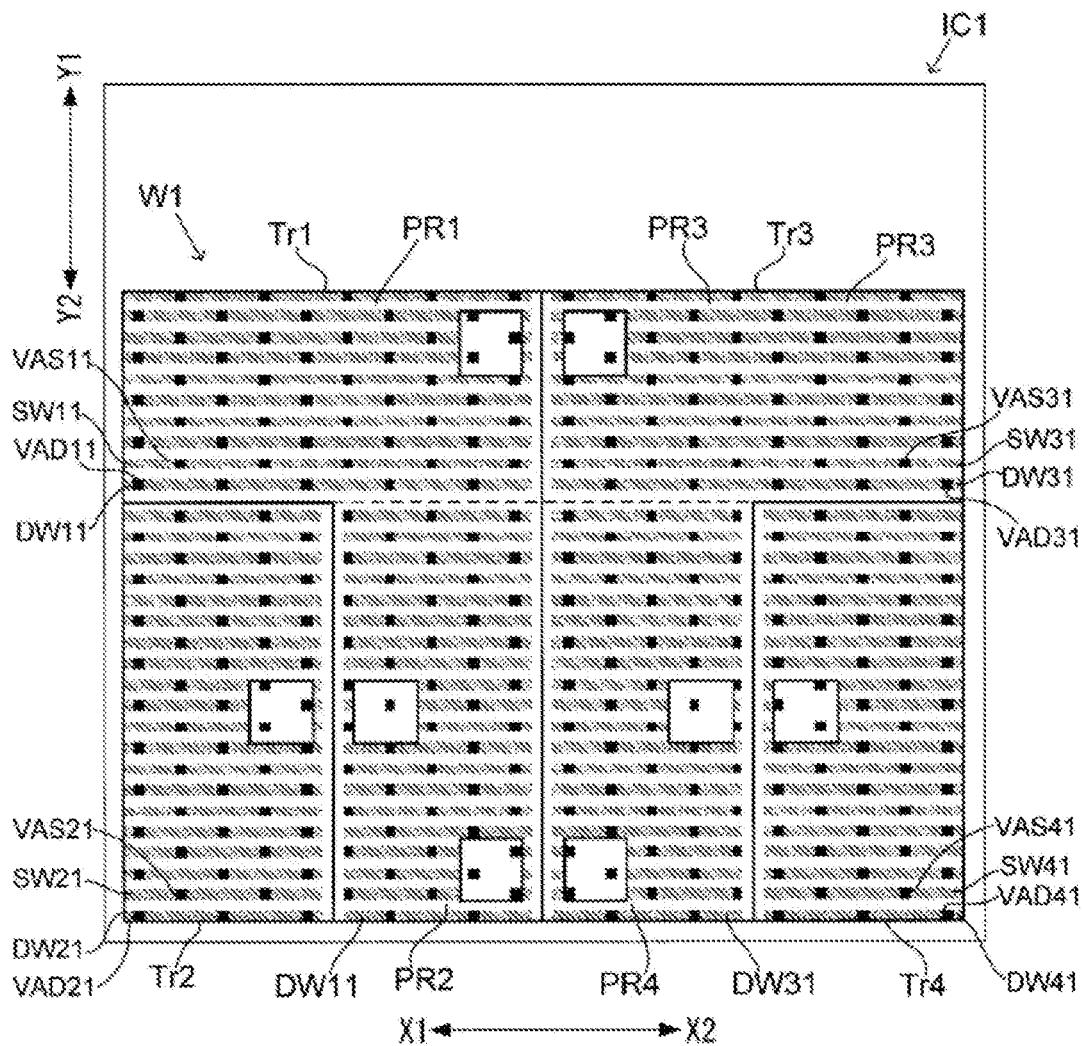
FIG. 7B is a plan view showing a lower layer wiring portion in the semiconductor integrated circuit according to the exemplary embodiment of the present disclosure.

FIG. 7B is a plan view of a lower layer wiring portion W1, which is disposed in a layer above the transistors arranged in the respective transistor arrangement regions Tr1 to Tr4 shown in FIG. 7A, in the semiconductor integrated circuit IC1. FIG. 7B also shows the transistor arrangement regions Tr1 to T4 and various pads (power supply pads PDV, etc.). Further, the lower layer wiring portion W1 is disposed in a layer below a middle layer wiring portion W2 and an upper layer wiring portion W3, which will be described later.

The configuration of the lower layer wiring portion W1 in the semiconductor integrated circuit IC1 according to the present embodiment is basically the same as that of the lower layer wiring portion in the first comparative example described above (see FIG. 5B). The configurations of drain regions and source regions in the transistor arrangement regions are basically the same as those of the first comparative example.

As shown in FIG. 7B, in the first transistor arrangement region Tr1, the first drain lower layer wirings DW11 and the first source lower layer wirings SW11 extending in the first direction are arranged alternately side by side in the second direction. More specifically, in each of the first partial region PR1 and the second partial region PR2, the first drain lower layer wiring DW11 is arranged at an end on the other side in the second direction, and the first drain lower layer wirings DW11 and the first source lower layer wirings SW11 are arranged alternately side by side in the second direction. Regarding lengths of the first drain lower layer wirings DW11 and the first source lower layer wirings SW11 in the first direction, the lengths in the second partial region PR2 are shorter than the lengths in the first partial region PR1.

Here, in the first transistor arrangement region Tr1, drain regions extending in the first direction are located at positions vertically facing the first drain lower layer wirings DW11, and source regions extending in the first direction are located at positions vertically facing the first source lower layer wirings SW11. That is, the drain regions and the source regions of the first high-side transistor QH1 are located alternately side by side in the second direction. The drain regions in the first transistor arrangement region Tr1 are electrically connected to the first drain lower layer wirings DW11, and the source regions in the first transistor arrangement region Tr1 are electrically connected to the first source lower layer wirings SW11.

Further, as shown in FIG. 7B, in the second transistor arrangement region Tr2, the second drain lower layer wirings DW21 and the second source lower layer wirings SW21 extending in the first direction are arranged alternately side by side in the second direction.

Here, in the second transistor arrangement region Tr2, drain regions extending in the first direction are located at positions vertically facing the second drain lower layer wirings DW21, and source regions extending in the first direction are located at positions vertically facing the second source lower layer wirings SW21. That is, the drain regions and the source regions of the first low-side transistor QL1 are located alternately side by side in the second direction. The drain regions in the second transistor arrangement region Tr2 are electrically connected to the second drain lower layer wirings DW21, and the source regions in the second transistor arrangement region Tr2 are electrically connected to the second source lower layer wirings SW21.

Further, as shown in FIG. 7B, in the third transistor arrangement region Tr3, the third drain lower layer wirings DW31 and the third source lower layer wirings SW31 extending in the first direction are arranged alternately side by side in the second direction. More specifically, in each of the third partial region PR3 and the fourth partial region PR4, the third drain lower layer wiring DW31 is arranged at an end on the other side in the second direction, and the third drain lower layer wirings DW31 and the third source lower layer wirings SW31 are arranged alternately side by side in the second direction. Regarding a length of the third drain lower layer wirings DW31 and the third source lower layer wirings SW31 in the first direction, the length in the fourth partial region PR4 is shorter than the length in the third partial region PR3.

Here, in the third transistor arrangement region Tr3, drain regions extending in the first direction are located at positions vertically facing the third drain lower layer wirings DW31, and source regions extending in the first direction are located at positions vertically facing the third source lower layer wirings SW31. That is, the drain regions and the source regions of the second high-side transistor QH2 are located alternately side by side in the second direction. The drain regions in the third transistor arrangement region Tr3 are electrically connected to the third drain lower layer wirings DW31, and the source regions in the third transistor arrangement region Tr3 are electrically connected to the third source lower layer wirings SW31.

Further, as shown in FIG. 7B, in the fourth transistor arrangement region Tr4, the fourth drain lower layer wirings DW41 and the fourth source lower layer wirings SW41 extending in the first direction are arranged alternately side by side in the second direction.

Here, in the fourth transistor arrangement region Tr4, drain regions extending in the first direction are located at positions vertically facing the fourth drain lower layer wirings DW41, and source regions extending in the first direction are located at positions vertically facing the fourth source lower layer wirings SW41. That is, the drain regions and the source regions of the second low-side transistor QL2 are located alternately side by side in the second direction. The drain regions in the fourth transistor arrangement region Tr4 are electrically connected to the fourth drain lower layer wirings DW41, and the source regions in the fourth transistor arrangement region Tr4 are electrically connected to the fourth source lower layer wirings SW41.

<Middle Layer Wiring Portion>

Figure 7C:
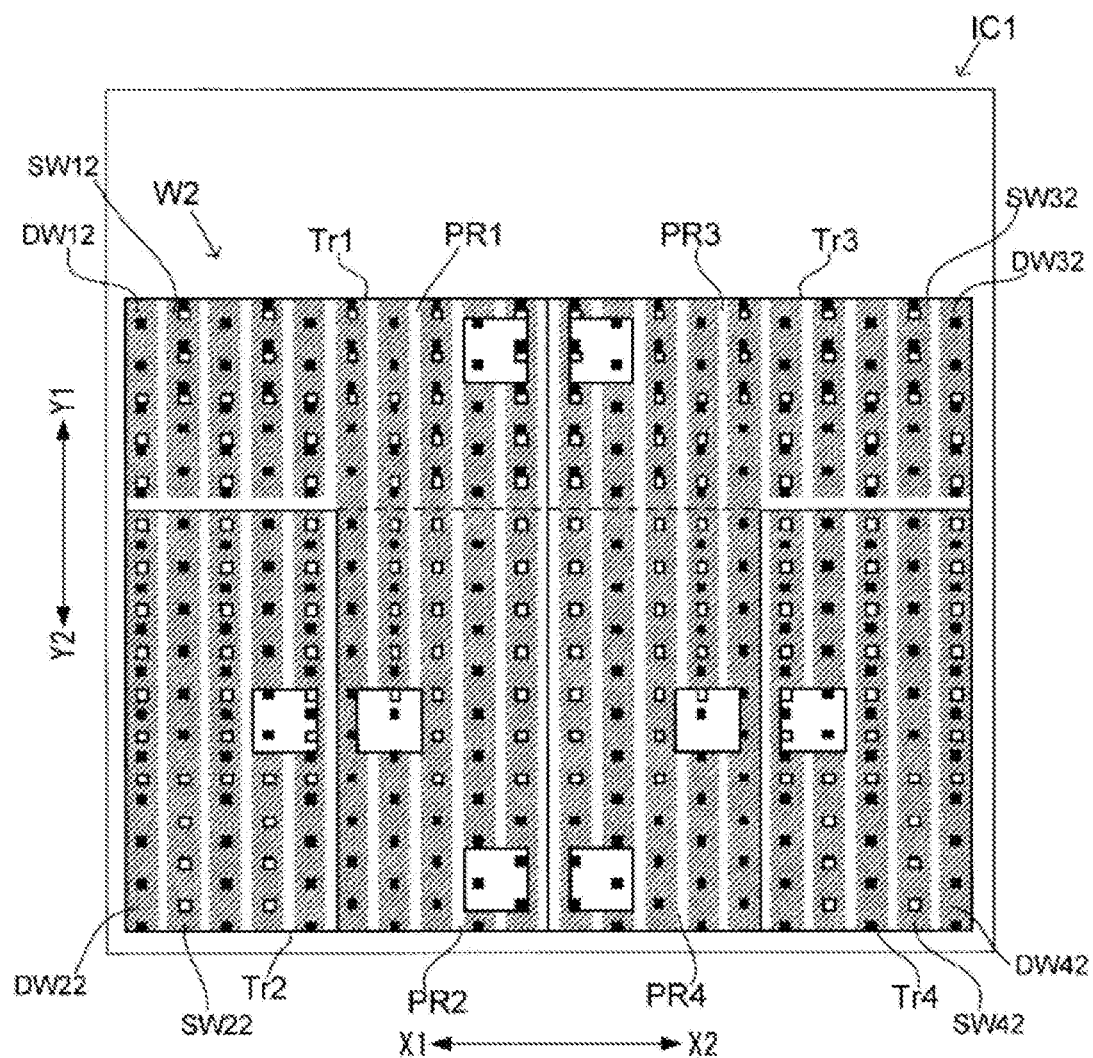
FIG. 7C is a plan view showing a middle layer wiring portion in the semiconductor integrated circuit according to the exemplary embodiment of the present disclosure.

FIG. 7C is a plan view of a middle layer wiring portion W2, which is disposed in a layer above the lower layer wiring portion W1 shown in FIG. 7B, in the semiconductor integrated circuit IC1. FIG. 7C also shows the transistor arrangement regions Tr1 to T4 and various pads (power supply pads PDV, etc.).

As shown in FIG. 7C, in the first transistor arrangement region Tr1, the first drain middle layer wirings DW12 and the first source middle layer wirings SW12 extending in the second direction are arranged alternately side by side in the first direction. The first drain middle layer wiring DW12 is arranged at an end of the first transistor arrangement region Tr1 on the one side in the first direction. A length in the second direction of the first drain middle layer wirings DW12 and the first source middle layer wirings SW12 arranged in a portion of the first partial region PR1 on the one side in the first direction is shorter than a length in the second direction of the first drain middle layer wirings DW12 and the first source middle layer wirings SW12 arranged in a portion of the first partial region PR1 on the other side in the first direction and in the second partial region PR2.

As shown in FIGS. 7B and 7C, the first drain lower side vias VAD11 (black squares) are arranged at positions where the first drain middle layer wirings DW12 and the first drain lower layer wirings DW11 overlap each other in a plan view. The first drain lower side vias VAD11 electrically connect the first drain middle layer wirings DW12 and the first drain lower layer wirings DW11.

As shown in FIGS. 7B and 7C, the first source lower side vias VAS11 (black squares) are arranged at positions where the first source middle layer wirings SW12 and the first source lower layer wirings SW11 overlap each other in a plan view. The first source lower side vias VAS11 electrically connect the first source middle layer wirings SW12 and the first source lower layer wirings SW11.

As a result, the first drain lower side vias VAD11 and the first source lower side vias VAS11 are arranged in a zigzag manner in a plan view.

Further, as shown in FIG. 7C, in the second transistor arrangement region Tr2, the second drain middle layer wirings DW22 and the second source middle layer wirings SW22 extending in the second direction are arranged alternately side by side in the first direction. The second drain middle layer wiring DW22 is arranged at an end of the second transistor arrangement region Tr2 on the one side in the first direction.

As shown in FIGS. 7B and 7C, the second drain lower side vias VAD21 (black squares) are arranged at positions where the second drain middle layer wirings DW22 and the second drain lower layer wirings DW21 overlap each other in a plan view. The second drain lower side vias VAD21 electrically connect the second drain middle layer wirings DW22 and the second drain lower layer wirings DW21.

As shown in FIGS. 7B and 7C, the second source lower side vias VAS21 (black squares) are arranged at positions where the second source middle layer wirings SW22 and the second source lower layer wirings SW21 overlap each other in a plan view. The second source lower side vias VAS21 electrically connect the second source middle layer wirings SW22 and the second source lower layer wirings SW21.

As a result, the second drain lower side vias VAD21 and the second source lower side vias VAS21 are arranged in a zigzag manner in a plan view.

As shown in FIG. 7C, in the third transistor arrangement region Tr3, the third drain middle layer wirings DW32 and the third source middle layer wirings SW32 extending in the second direction are arranged alternately side by side in the first direction. The third drain middle layer wiring DW32 is arranged at an end of the third transistor arrangement region Tr3 on the other side in the first direction. A length in the second direction of the third drain middle layer wirings DW32 and the third source middle layer wirings SW32 arranged in a portion of the third partial region PR3 on the other side in the first direction is shorter than a length in the second direction of the third drain middle layer wirings DW32 and the third source middle layer wirings SW32 arranged in a portion of the third partial region PR3 on the one side in the first direction and the fourth partial region PR4.

As shown in FIGS. 7B and 7C, the third drain lower side vias VAD31 (black squares) are arranged at positions where the third drain middle layer wirings DW32 and the third drain lower layer wirings DW31 overlap each other in a plan view. The third drain lower side vias VAD31 electrically connect the third drain middle layer wirings DW32 and the third drain lower layer wirings DW31.

As shown in FIGS. 7B and 7C, the third source lower side vias VAS31 (black squares) are arranged at positions where the third source middle layer wirings SW32 and the third source lower layer wirings SW31 overlap each other in a plan view. The third source lower side vias VAS31 electrically connect the third source middle layer wirings SW32 and the third source lower layer wirings SW31.

As a result, the third drain lower side vias VAD31 and the third source lower side vias VAS31 are arranged in a zigzag manner in a plan view.

Further, as shown in FIG. 7C, in the fourth transistor arrangement region Tr4, the fourth drain middle layer wirings DW42 and the fourth source middle layer wirings SW42 extending in the second direction are arranged alternately side by side in the first direction. The fourth drain middle layer wiring DW42 is arranged at an end of the fourth transistor arrangement region Tr4 on the other side in the first direction.

Further, as shown in FIGS. 7B and 7C, the fourth drain lower side vias VAD41 (black squares) are arranged at positions where the fourth drain middle layer wirings DW42 and the fourth drain lower layer wirings DW41 overlap each other in a plan view. The fourth drain lower side vias VAD41 electrically connect the fourth drain middle layer wirings DW42 and the fourth drain lower layer wirings DW41.

As shown in FIGS. 7B and 7C, the fourth source lower side vias VAS41 (black squares) are arranged at positions where the fourth source middle layer wirings SW42 and the fourth source lower layer wirings SW41 overlap each other in a plan view. The fourth source lower side vias VAS41 electrically connect the fourth source middle layer wirings SW42 and the fourth source lower layer wirings SW41.

As a result, the fourth drain lower side vias VAD41 and the fourth source lower side vias VAS41 are arranged in a zigzag manner in a plan view.

<Upper Layer Wiring Portion>

Figure 7D:
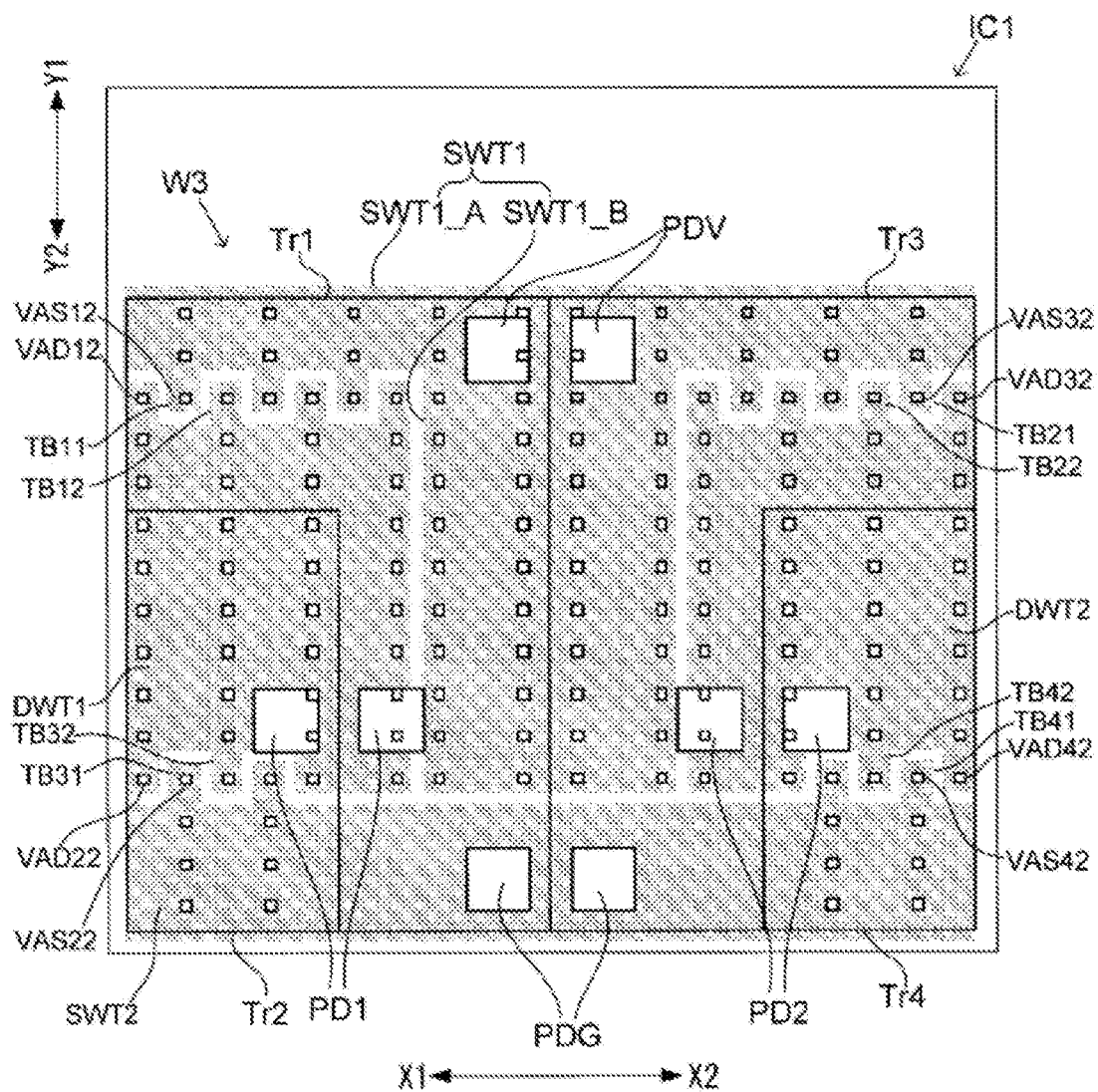
FIG. 7D is a plan view showing an upper layer wiring portion in the semiconductor integrated circuit according to the exemplary embodiment of the present disclosure.

FIG. 7D is a plan view of an upper layer wiring portion W3, which is disposed in a layer above the middle layer wiring portion W2 shown in FIG. 7C, in the semiconductor integrated circuit IC1. FIG. 7D also shows the transistor arrangement regions Tr1 to T4 and various pads (power supply pads PDV, etc.).

As shown in FIG. 7D, the upper layer wiring portion W3 includes the first source upper layer wiring SWT1, the second source upper layer wiring SWT2, the first drain upper layer wiring DWT1, and the second drain upper layer wiring DWT2.

The first source upper layer wiring SWT1 includes an extending portion SWT1_A, which overlaps an end of the first transistor arrangement region Tr1 on the one side in the second direction and an end of the third transistor arrangement region Tr3 on the one side in the second direction in a plan view and extends in the first direction, and a protruding portion SWT1_B, which protrudes from a center of the extending portion SWT1_A in the first direction toward the other side in the second direction. That is, the first source upper layer wiring SWT1 has substantially a T shape.

End portions TB11 of the extending portion SWT1_A, which are disposed on the one side in the first direction and on the other side in the second direction, and end portions TB12 of the first drain upper layer wiring DWT1 on the one side in the second direction are alternately arranged in the first direction. End portions TB21 of the extending portion SWT1_A, which are disposed on the other side in the first direction and on the other side in the second direction, and end portions TB22 of the second drain upper layer wiring DWT2 on the one side in the second direction are alternately arranged in the first direction.

The first drain upper layer wiring DWT1 and the second drain upper layer wiring DWT2 are arranged side by side in the first direction on the other side of the first source upper layer wiring SWT1 in the second direction, and sandwich the protruding portion SWT1_B from both sides in the first direction.

The first drain upper layer wiring DWT1 is formed so as to overlap the first transistor arrangement region Tr1 and the second transistor arrangement region Tr2 in a plan view and extend in the second direction. The second drain upper layer wiring DWT2 is disposed on the other side of the first drain upper layer wiring DWT1 in the first direction. The second drain upper layer wiring DWT2 is formed so as to overlap the third transistor arrangement region Tr3 and the fourth transistor arrangement region Tr4 in a plan view and extend in the second direction.

The second source upper layer wiring SWT2 is formed so as to overlap the first transistor arrangement region Tr1 to the fourth transistor arrangement region Tr4 in a plan view and extend in the first direction. The second source upper layer wiring SWT2 is disposed on the other side of the first drain upper layer wiring DWT1, the protruding portion SWT1_B, and the second drain upper layer wiring DWT2 in the second direction.

End portions TB31 of the second source upper layer wiring SWT2, which are disposed on the one side in the first direction and on the one side in the second direction, and end portions TB32 of the first drain upper layer wiring DWT1 on the other side in the second direction are alternately arranged in the first direction. End portions TB41 of the second source upper layer wiring SWT2, which are disposed on the other side in the first direction and on the one side in the second direction, and end portions TB42 of the second drain upper layer wiring DWT2 on the other side in the second direction are alternately arranged in the first direction.

As shown in FIGS. 7C and 7D, the first source upper side vias VAS12 (white squares) are arranged at positions where the first source upper layer wiring SWT1 and the first source middle layer wirings SW12 overlap each other in a plan view. The first source upper side vias VAS12 electrically connect the first source upper layer wiring SWT1 and the first source middle layer wirings SW12.

As shown in FIGS. 7C and 7D, the third source upper side vias VAS32 (white squares) are arranged at positions where the first source upper layer wiring SWT1 and the third source middle layer wirings SW32 overlap each other in a plan view. The third source upper side vias VAS32 electrically connect the first source upper layer wiring SWT1 and the third source middle layer wirings SW32.

As shown in FIG. 7D, two power supply pads PDV are formed as a portion of the first source upper layer wiring SWT1. The power supply pads PDV are arranged in a vicinity of a boundary between the first transistor arrangement region Tr1 and the third transistor arrangement region Tr3 in a plan view so as to sandwich the boundary from both sides in the first direction, and are arranged at ends of the first transistor arrangement region Tr1 and the third transistor arrangement region Tr3 on the one side in the second direction.

As a result, the power supply pads PDV are electrically connected to the source region of the first high-side transistor QH1 disposed in the first transistor arrangement region Tr1 and the source region of the second high-side transistor QH2 disposed in the third transistor arrangement region Tr3. The power supply pads PDV are connected to the power supply terminal VS to which the power supply voltage Vs is applied, by wires Wr, as shown in FIG. 7A.

Further, as shown in FIGS. 7C and 7D, the first drain upper side vias VAD12 (white squares) are arranged at positions where the first drain upper layer wiring DWT1 and the first drain middle layer wirings DW12 overlap each other in a plan view. The first drain upper side vias VAD12 electrically connect the first drain upper layer wiring DWT1 and the first drain middle layer wirings DW12.

As shown in FIGS. 7C and 7D, the second drain upper side vias VAD22 (white squares) are arranged at positions where the first drain upper layer wiring DWT1 and the second drain middle layer wirings DW22 overlap each other in a plan view. The second drain upper side vias VAD22 electrically connect the first drain upper layer wiring DWT1 and the second drain middle layer wirings DW22.

As shown in FIG. 7D, two first output pads PD1 are formed as a portion of the first drain upper layer wiring DWT1. The first output pads PD1 are arranged in a vicinity of a boundary between the first transistor arrangement region Tr1 and the second transistor arrangement region Tr2 in a plan view so as to sandwich the boundary from both sides in the first direction. The first output pads PD1 are arranged at a center position of the second transistor arrangement region Tr2 in the second direction.

As a result, the first output pads PD1 are electrically connected to the drain region of the first high-side transistor QH1 disposed in the first transistor arrangement region Tr1 and the drain region of the first low-side transistor QL1 disposed in the second transistor arrangement region Tr2. The first output pads PD1 are connected to the output terminal OUT1 by the wires Wr, as shown in FIG. 7A.

Further, as shown in FIGS. 7C and 7D, the third drain upper side vias VAD32 (white squares) are arranged at positions where the second drain upper layer wiring DWT2 and the third drain middle layer wirings DW32 overlap each other in a plan view. The third drain upper side vias VAD32 electrically connect the second drain upper layer wiring DWT2 and the third drain middle layer wirings DW32.

As shown in FIGS. 7C and 7D, the fourth drain upper side vias VAD42 (white squares) are arranged at positions where the second drain upper layer wiring DWT2 and the fourth drain middle layer wirings DW42 overlap each other in a plan view. The fourth drain upper side vias VAD42 electrically connect the second drain upper layer wiring DWT2 and the fourth drain middle layer wirings DW42.

As shown in FIG. 7D, two second output pads PD2 are formed as a portion of the second drain upper layer wiring DWT2. The second output pads PD2 are arranged in a vicinity of a boundary between the third transistor arrangement region Tr3 and the fourth transistor arrangement region Tr4 in a plan view so as to sandwich the boundary from both sides in the first direction. The second output pads PD2 are arranged at a center position of the fourth transistor arrangement region Tr4 in the second direction.

As a result, the second output pads PD2 are electrically connected to the drain region of the second high-side transistor QH2 disposed in the third transistor arrangement region Tr3 and the drain region of the second low-side transistor QL2 disposed in the fourth transistor arrangement region Tr4. The second output pads PD2 are connected to the output terminal OUT2 by the wires Wr, as shown in FIG. 7A.

As shown in FIGS. 7C and 7D, the second source upper side vias VAS22 (white squares) are arranged at positions where the second source upper layer wiring SWT2 and the second source middle layer wirings SW22 overlap each other in a plan view. The second source upper side vias VAS22 electrically connect the second source upper layer wiring SWT2 and the second source middle layer wirings SW22.

As shown in FIGS. 7C and 7D, the fourth source upper side vias VAS42 (white squares) are arranged at positions where the second source upper layer wiring SWT2 and the fourth source middle layer wirings SW42 overlap each other in a plan view. The fourth source upper side vias VAS42 electrically connect the second source upper layer wiring SWT2 and the fourth source middle layer wirings SW42.

As shown in FIG. 7D, two ground pads PDG are formed as a portion of the second source upper layer wiring SWT2. The ground pads PDG are arranged in a vicinity of a boundary between the first transistor arrangement region Tr1 and the third transistor arrangement region Tr3 in a plan view so as to sandwich the boundary from both sides in the first direction, and are arranged at ends of the first transistor arrangement region Tr1 and the third transistor arrangement region Tr3 on the other side in the second direction.

As a result, the ground pads PDG are electrically connected to the source region of the first low-side transistor QL1 disposed in the second transistor arrangement region Tr2 and the source region of the second low-side transistor QL2 disposed in the fourth transistor arrangement region Tr4. The ground pads PDG are connected to the ground terminal GND to which the ground potential is applied, by the wires Wr, as shown in FIG. 7A.

<Example of Application to Stepping Motor Drive>

Figure 8:
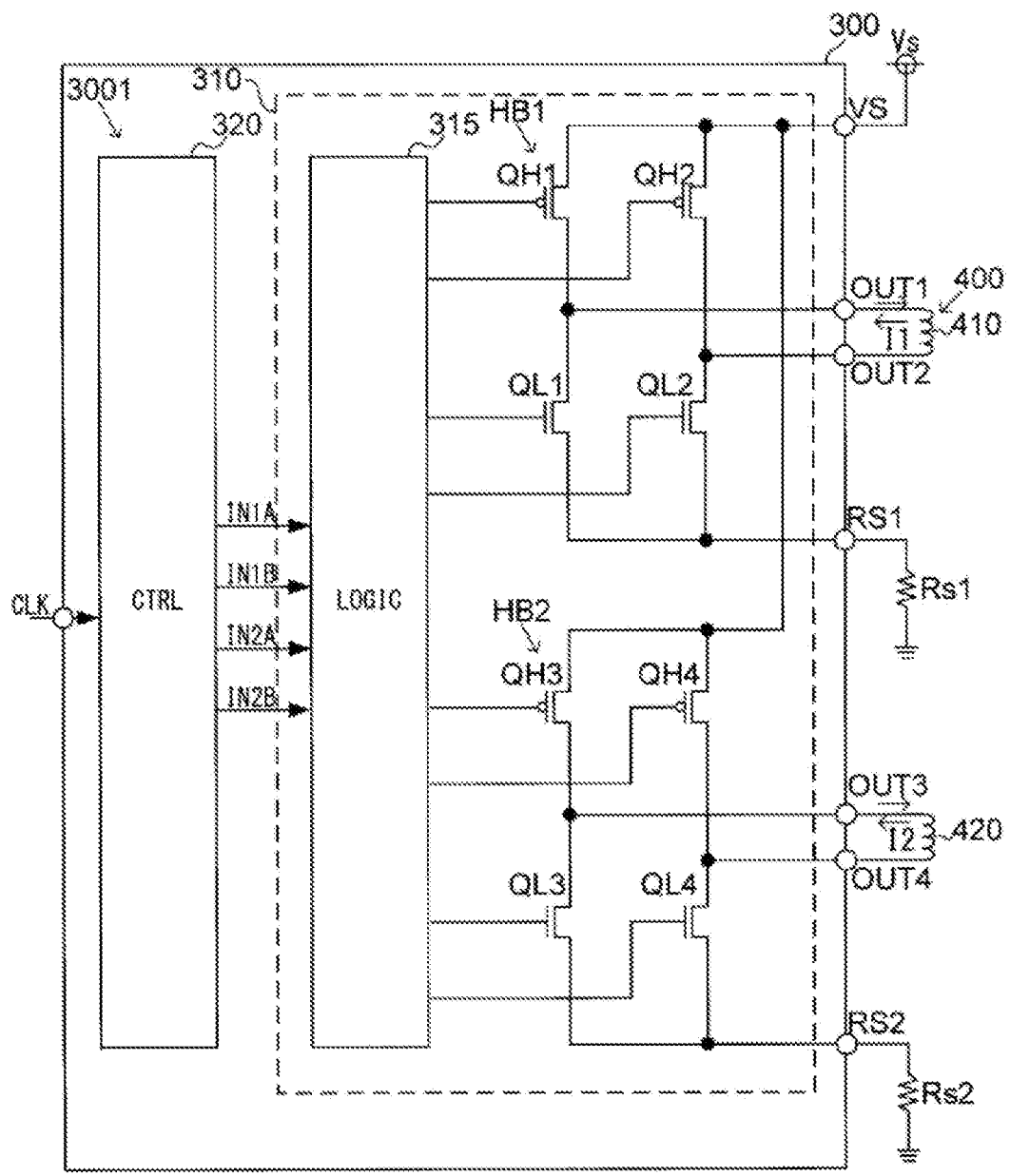
FIG. 8 is a diagram showing an internal configuration of a motor driver according to a modification of the present disclosure.

Next, an example of a case when the embodiment of the present disclosure is applied to drive a stepping motor will be described. FIG. 8 is a block diagram showing an example of an internal configuration of a motor driver 300 for driving a stepping motor 400. The stepping motor 400 is a two-phase excitation type stepping motor (the stepping motor 400 is hereinafter simply abbreviated as the motor 400).

The motor 400 has an exciting coil 410 of a first excitation phase and an exciting coil 420 of a second excitation phase. When the motor 400 is driven to be rotated, drive currents I1 and I2 are supplied from the motor driver 300 to the exciting coils 410 and 420, respectively.

The motor driver 300 is a semiconductor device that generates the drive currents I1 and I2 of the motor 400 in response to various control signals (only a clock signal CLK is illustrated in FIG. 8) input from the outside, and is configured by packaging a semiconductor integrated circuit 3001. The semiconductor integrated circuit 3001 has a drive part 310 and a control part 320 which are integrated.

The control part 320 receives the clock signal CLK, generates input signals IN1A and IN1B for performing a drive control of the first excitation phase and input signals IN2A and IN2B for performing a drive control of the second excitation phase, and outputs these input signals to the drive part 310.

The clock signal CLK is a rectangular wave signal that is pulse-driven at a predetermined frequency. The control part 320 generates the input signals IN1A and IN1B and the input signals IN2A and IN2B so as to rotate the motor 400 by a predetermined step angle in synchronization with a pulse edge of the clock signal CLK. That is, a rotational speed of the motor 400 changes according to the frequency of the clock signal CLK.

The drive part 310 includes a logic circuit 315, an H-bridge output stage HB1, and an H-bridge output stage HB2.

The H-bridge output stage HB1 has a half-bridge output stage composed of a high-side transistor QH1 and a low-side transistor QL1, and a half-bridge output stage composed of a high-side transistor QH2 and a low-side transistor QL2. A configuration of the H-bridge output stage HB1 is basically the same as that of the H-bridge output stage composed of the high-side transistors QH1 and QH2 and the low-side transistors QL1 and QL2, which are shown in FIG. 2 as described above. However, in the configuration of FIG. 8, the exciting coil 410 is connected between an output terminal OUT1 and an output terminal OUT2. Further, a source of each of the low-side transistors QL1 and QL2 is connected to a sense resistance terminal RS1. A sense resistor Rs1 is connected to the sense resistor terminal RS1.

The H-bridge output stage HB2 has a half-bridge output stage composed of a high-side transistor QH3 and a low-side transistor QL3, and a half-bridge output stage composed of a high-side transistor QH4 and a low-side transistor QL4. A configuration of the H-bridge output stage HB2 is basically the same as that of the H-bridge output stage composed of the high-side transistors QH3 and QH4 and the low-side transistors QL3 and QL4, which are shown in FIG. 2 as described above. However, in the configuration of FIG. 8, the exciting coil 420 is connected between an output terminal OUT3 and an output terminal OUT4. Further, a source of each of the low-side transistors QL3 and QL4 is connected to a sense resistance terminal RS2. A sense resistor Rs2 is connected to the sense resistor terminal RS2.

The logic circuit 315 performs an ON and OFF control of each transistor in the H-bridge output stage HB1 according to the input signals IN1A and IN1B. Specifically, for example, when (IN1A, IN1B)=(H, L), a current-ON operation is performed in which the high-side transistor QH1 and the low-side transistor QL2 are turned on and the high-side transistor QH2 and the low-side transistor QL1 are turned off. When (IN1A, IN1B)=(L, H), a current-ON operation is performed in which the high-side transistor QH1 and the low-side transistor QL2 are turned off and the high-side transistor QH2 and the low-side transistor QL1 are turned on. Further, when (IN1A, IN1B)=(L, L), a current-OFF operation is performed in which the ON and OFF control of each transistor is performed so that the drive current I1 flowing until then is attenuated.

The logic circuit 315 also performs an ON and OFF control of each transistor in the H-bridge output stage HB2 according to the input signals IN2A and IN2B. Specifically, for example, when (IN2A, IN2B)=(H, L), a current-ON operation is performed in which the high-side transistor QH3 and the low-side transistor QL4 are turned on and the high-side transistor QH4 and the low-side transistor QL3 are turned off. When (IN2A, IN2B)=(L, H), a current-ON operation is performed in which the high-side transistor QH3 and the low-side transistor QL4 are turned off and the high-side transistor QH4 and the low-side transistor QL3 are turned on. Further, when (IN2A, IN2B)=(L, L), a current-OFF operation is performed in which the ON and OFF control of each transistor is performed so that the drive current I2 flowing until then is attenuated.

Further, the logic circuit 315 also has a function of monitoring sense voltages generated in the sense resistance terminals RS1 and RS2 and adjusting the drive currents I1 and 12 (a constant current chopping function that keeps a current value constant by chopping an ON period of each of the drive currents I1 and 12).

In such an H-bridge output stage HB1, all of the transistors may be turned off in the current-OFF operation performed after the current-ON operation. In that case, during the current-OFF operation, one of the output terminals OUT1 and OUT2 has a negative voltage, and the other has a positive voltage. At this time, a current flowing in the latch-up structure formed by the high-side transistor QH2 (QH1) and the low-side transistor QL1 (QL2) as described above becomes a problem. The same problem occurs in the H-bridge output stage HB2.

Figure 9:
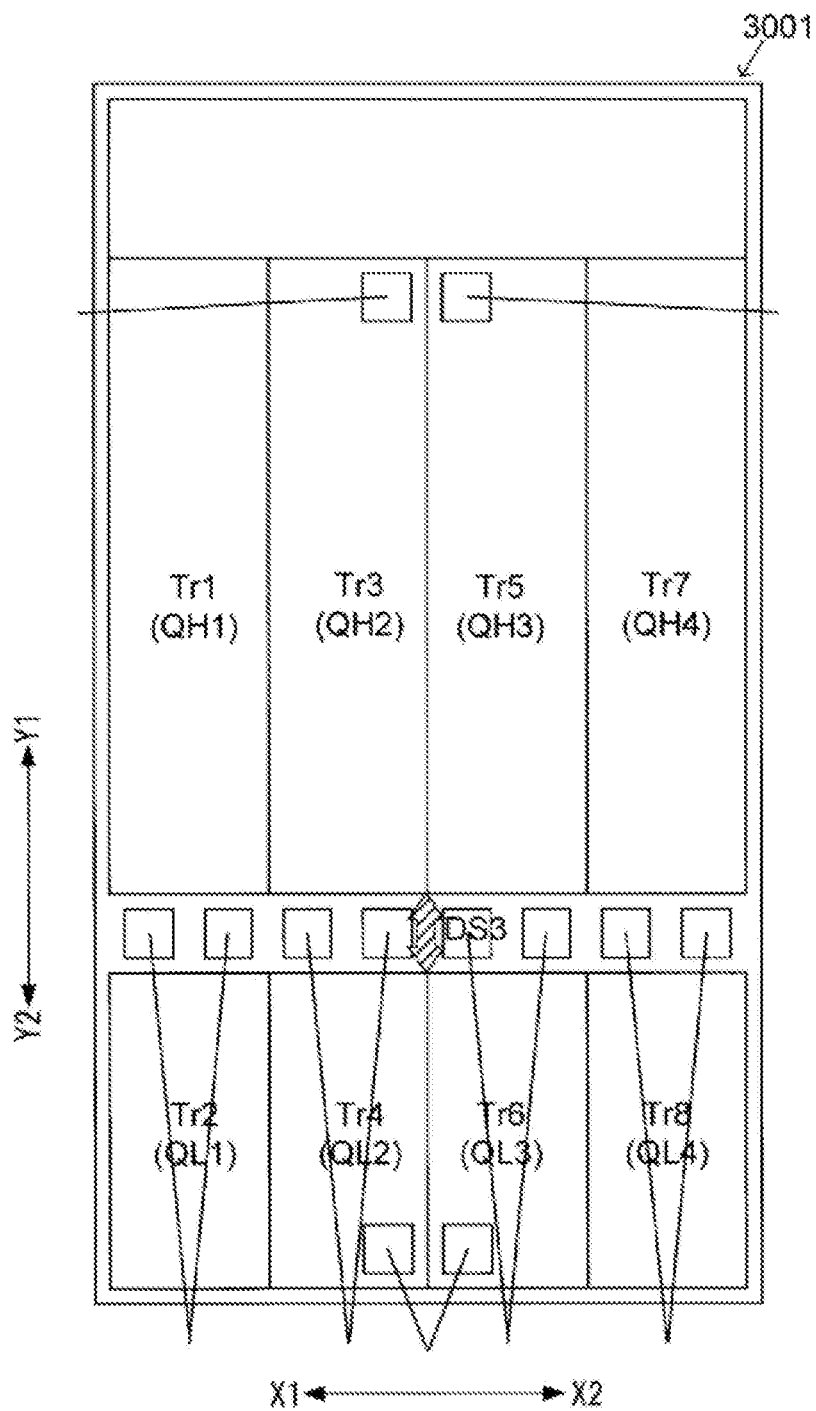
FIG. 9 is a plan view showing a transistor arrangement region in a semiconductor integrated circuit according to a third comparative example.

FIG. 9 is a plan view showing a layout example of each transistor arrangement region in the semiconductor integrated circuit 3001 for solving the problem due to the latch-up as described above. The high-side transistors QH1, QH2, QH3, and QH4 are arranged in transistor arrangement regions Tr1, Tr3, Try, and Tr7, respectively. The low-side transistors QL1, QL2, QL3, and QL4 are arranged in transistor arrangement regions Tr2, Tr4, Tr6, and Tr8, respectively.

In the layout shown in FIG. 9, the transistor arrangement region Tr1 and the transistor arrangement region Tr3 extending in the second direction are connected to each other in the first direction, and the transistor arrangement region Tr2 and the transistor arrangement region Tr4 extending in the second direction are connected to each other in the first direction. A set consisting of the transistor arrangement regions Tr2 and Tr4 is disposed on the other side of a set consisting of the transistor arrangement regions Tr1 and Tr3 in the second direction and is distanced therefrom by a distance DS3 in the second direction.

As a result, a distance between the transistor arrangement regions Tr2 and Tr3 and a distance between the transistor arrangement regions Tr4 and Tr1 can be secured, thereby suppressing a current flowing in the latch-up structure.

Similarly, in the layout shown in FIG. 9, the transistor arrangement region Tr5 and the transistor arrangement region Tr7 extending in the second direction are connected to each other in the first direction, and the transistor arrangement region Tr6 and the transistor arrangement region Tr8 extending in the second direction are connected to each other in the first direction. A set consisting of the transistor arrangement regions Tr6 and Tr8 is disposed on the other side of a set consisting of the transistor arrangement regions Tr5 and Tr7 in the second direction and is distanced therefrom by the distance DS3 in the second direction.

As a result, a distance between the transistor arrangement regions Tr6 and Tr7 and a distance between the transistor arrangement regions Tr8 and Tr5 can be secured, thereby suppressing the current flowing in the latch-up structure.

However, in the layout shown in FIG. 9, there is a problem that a circuit area of the semiconductor integrated circuit 3001 becomes large. Therefore, the present embodiment adopts the layout shown in FIG. 10.

In the layout shown in FIG. 10, the transistor arrangement regions Tr1 to Tr4 related to the H-bridge output stage HB1 are located on the other side in the second direction, and the transistor arrangement regions Tr5 to Tr8 related to the H-bridge output stage HB2 are located on the one side in the second direction. An area of the transistor arrangement regions Tr1 to Tr8 in a plan view are the same as that in FIG. 9.

The layout of the transistor arrangement regions Tr1 to Tr4 is the same as that of FIG. 7A described above. The layout of the transistor arrangement regions Tr5 to Tr8 is line-symmetric with the transistor arrangement regions Tr1 to Tr4 with respect to a symmetric axis J extending in the first direction. As a result, while securing a distance between the transistor arrangement regions Tr2 and Tr3 and a distance between the transistor arrangement regions Tr4 and Tr1 and securing a distance between the transistor arrangement regions Tr6 and Tr7 and a distance between the transistor arrangement regions Tr8 and Try, the circuit area of the semiconductor integrated circuit 3001 can be reduced as compared with FIG. 9 (see a black arrow in FIG. 10).

That is, in the present embodiment, in a semiconductor integrated circuit for driving a stepping motor, a circuit area can be reduced while solving the problem of a parasitic current due to a latch-up structure.

<Others>

Although the embodiments of the present disclosure have been described above, the embodiments can be changed in various ways within the scope and spirit of the present disclosure.

For example, the high-side transistors in the H-bridge output stage may be N-channel type transistors. In this case, the latch-up does not occur, but a current flowing through a parasitic bipolar transistor becomes a problem. Therefore, by securing a distance between the transistor arrangement regions as in the above-described embodiments, it is possible to reduce the circuit area of the semiconductor integrated circuit while suppressing the current flowing through the parasitic bipolar transistor.

INDUSTRIAL APPLICABILITY

The present disclosure can be used to drive motors for various purposes.

According to the present disclosure in some embodiments, it is possible to reduce a circuit area while suppressing a parasitic current in a semiconductor integrated circuit for driving a motor.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor integrated circuit comprising:
a first integrated H-bridge output stage including:
a first half-bridge output stage having a first high-side transistor of a P-channel type or an N-channel type and a first low-side transistor of an N-channel type connected in series with the first high-side transistor; and
a second half-bridge output stage having a second high-side transistor of a P-channel type or an N-channel type and a second low-side transistor of an N-channel type connected in series with the second high-side transistor,
wherein a portion of a third transistor arrangement region in which the second high-side transistor is disposed is located on a second side in a first direction of a second transistor arrangement region in which the first low-side transistor is disposed, wherein a portion of a first transistor arrangement region in which the first high-side transistor is disposed is located so as to be sandwiched in the first direction by the second transistor arrangement region and the portion of the third transistor arrangement region, and is connected to the second transistor arrangement region, wherein the portion of the first transistor arrangement region is located on a first side in the first direction of a fourth transistor arrangement region in which the second low-side transistor is disposed, and wherein the portion of the third transistor arrangement region is located so as to be sandwiched in the first direction by the fourth transistor arrangement region and the portion of the first transistor arrangement region, and is connected to the fourth transistor arrangement region.

2. The semiconductor integrated circuit of claim 1, wherein the first transistor arrangement region includes:
 a first partial region that is connected to a first side in a second direction, which is a direction orthogonal to the first direction, of the second transistor arrangement region, and extends in the first direction; and
 a second partial region that is connected to the second side in the first direction of the second transistor arrangement region and the second side in the second direction of the first partial region, and extends in the second direction, and wherein the third transistor arrangement region includes:
 a third partial region that is connected to the first side in the second direction of the fourth transistor arrangement region, and extends in the first direction; and
 a fourth partial region that is connected to the first side in the first direction of the fourth transistor arrangement region and the second side in the second direction of the third partial region, and extends in the second direction.

3. The semiconductor integrated circuit of claim 2, further comprising:
 a square region that is formed in a square shape having sides extending in the first direction and the second direction, respectively, in a plan view, and is divided into a first division region on the first side in the first direction and a second division region on the second side in the first direction, wherein the second transistor arrangement region is formed in a square shape having sides extending in the first direction and the second direction, respectively, in a plan view, wherein a corner on the first side in the first direction and the second side in the second direction in the second transistor arrangement region coincides with a corner on the first side in the first direction and the second side in the second direction in the first division region, wherein the fourth transistor arrangement region is formed in a square shape having sides extending in the first direction and the second direction, respectively, in a plan view, and wherein a corner on the second side in the first direction and the second side in the second direction in the fourth transistor arrangement region coincides with a corner on the second side in the first direction and the second side in the second direction in the second division region.

4. The semiconductor integrated circuit of claim 3, wherein an area of the first transistor arrangement region in a plan view is twice an area of the second transistor arrangement region in a plan view, wherein an area of the third transistor arrangement region in a plan view is twice an area of the fourth transistor arrangement region in a plan view, and wherein the area of the first transistor arrangement region is equal to the area of the third transistor arrangement region.

5. The semiconductor integrated circuit of claim 4, wherein a length of the side extending in the first direction of the second transistor arrangement region is half of a length of a side extending in the first direction of the first division region, and wherein a length of the side extending in the first direction of the fourth transistor arrangement region is half of a length of a side extending in the first direction of the second division region.

6. The semiconductor integrated circuit of claim 2, further comprising:
 a lower layer wiring portion including first to fourth drain lower layer wirings and first to fourth source lower layer wirings;
 a middle layer wiring portion including first to fourth drain middle layer wirings and first to fourth source middle layer wirings; and
 an upper layer wiring portion including first and second drain upper layer wirings and first and second source upper layer wirings.

7. The semiconductor integrated circuit of claim 6, wherein in the first transistor arrangement region, the first drain lower layer wirings and the first source lower layer wirings, which extend in the first direction, are arranged alternately side by side in the second direction, and wherein a length in the first direction of the first drain lower layer wirings and the first source lower layer wirings in the second partial region is shorter than a length in the first direction of the first drain lower layer wirings and the first source lower layer wirings in the first partial region.

8. The semiconductor integrated circuit of claim 7, wherein in the second transistor arrangement region, the second drain lower layer wirings and the second source lower layer wirings, which extend in the first direction, are arranged alternately side by side in the second direction, wherein in the third transistor arrangement region, the third drain lower layer wirings and the third source lower layer wirings, which extend in the first direction, are arranged alternately side by side in the second direction, and wherein a length in the first direction of the third drain lower layer wirings and the third source lower layer wirings in the fourth partial region is shorter than a length in the first direction of the third drain lower layer wirings and the third source lower layer wirings in the third partial region.

9. The semiconductor integrated circuit of claim 8, wherein in the fourth transistor arrangement region, the fourth drain lower layer wirings and the fourth source lower layer wirings, which extend in the first direction, are arranged alternately side by side in the second direction, wherein in the first transistor arrangement region, the first drain middle layer wirings and the first source middle layer wirings, which extend in the second direction, are arranged alternately side by side in the first direction, and wherein a length in the second direction of the first drain middle layer wirings and the first source middle layer wirings arranged in a portion of the first partial region on the first side in the first direction is shorter than a length in the second direction of the first drain middle layer wirings and the first source middle layer wirings arranged in a portion of the first partial region on the second side in the first direction and the second partial region.

10. The semiconductor integrated circuit of claim 9, wherein in the second transistor arrangement region, the second drain middle layer wirings and the second source middle layer wirings, which extend in the second direction, are arranged alternately side by side in the first direction,
wherein in the third transistor arrangement region, the third drain middle layer wirings and the third source middle layer wirings, which extend in the second direction, are arranged alternately side by side in the first direction, and
wherein a length in the second direction of the third drain middle layer wirings and the third source middle layer wirings arranged in a portion of the third partial region on the second side in the first direction is shorter than a length in the second direction of the third drain middle layer wirings and the third source middle layer wirings arranged in a portion of the third partial region on the first side in the first direction and the fourth partial region.

11. The semiconductor integrated circuit of claim 10, wherein in the fourth transistor arrangement region, the fourth drain middle layer wirings and the fourth source middle layer wirings, which extend in the second direction, are arranged alternately side by side in the first direction.

12. The semiconductor integrated circuit of claim 11, wherein first drain lower side vias are arranged at positions where the first drain middle layer wirings and the first drain lower layer wirings overlap each other in a plan view,
wherein first source lower side vias are arranged at positions where the first source middle layer wirings and the first source lower layer wirings overlap each other in a plan view,
wherein second drain lower side vias are arranged at positions where the second drain middle layer wirings and the second drain lower layer wirings overlap each other in a plan view,
wherein second source lower side vias are arranged at positions where the second source middle layer wirings and the second source lower layer wirings overlap each other in a plan view,
wherein third drain lower side vias are arranged at positions where the third drain middle layer wirings and the third drain lower layer wirings overlap other in a plan view,
wherein third source lower side vias are arranged at positions where the third source middle layer wirings and the third source lower layer wirings overlap each other in a plan view,
wherein fourth drain lower side vias are arranged at positions where the fourth drain middle layer wirings and the fourth drain lower layer wirings overlap each other in a plan view, and
wherein fourth source lower side vias are arranged at positions where the fourth source middle layer wirings and the fourth source lower layer wirings overlap each other in a plan view.

13. The semiconductor integrated circuit of claim 12, wherein the first source upper layer wiring has an extending portion that overlaps an end of the first transistor arrangement region on the first side in the second direction and an end of the third transistor arrangement region on the first side in the second direction in a plan view and extends in the first direction, and a protruding portion that protrudes from a center of the extending portion in the first direction toward the second side in the second direction.

14. The semiconductor integrated circuit of claim 13, wherein the first drain upper layer wiring and the second drain upper layer wiring are disposed on the second side of the first source upper layer wiring in the second direction and arranged side by side in the first direction to sandwich the protruding portion from both sides in the first direction,
wherein the first drain upper layer wiring is formed so as to overlap the first transistor arrangement region and the second transistor arrangement region in a plan view,
wherein the second drain upper layer wiring is disposed on the second side of the first drain upper layer wiring in the first direction, and is formed so as to overlap the third transistor arrangement region and the fourth transistor arrangement region in a plan view, and
wherein the second source upper layer wiring is formed so as to overlap the first to fourth transistor arrangement regions in a plan view and extend in the first direction, and is disposed on the second side of the first drain upper layer wiring, the protruding portion, and the second drain upper layer wiring in the second direction.

15. The semiconductor integrated circuit of claim 14, wherein first source upper side vias are arranged at positions where the first source upper layer wiring and the first source middle layer wirings overlap each other in a plan view,
wherein third source upper side vias are arranged at positions where the first source upper layer wiring and the third source middle layer wirings overlap each other in a plan view,
wherein first drain upper side vias are arranged at positions where the first drain upper layer wiring and the first drain middle layer wirings overlap each other in a plan view,
wherein second drain upper side vias are arranged at positions where the first drain upper layer wiring and the second drain middle layer wirings overlap each other in a plan view,
wherein third drain upper side vias are arranged at positions where the second drain upper layer wiring and the third drain middle layer wirings overlap each other in a plan view,
wherein fourth drain upper side vias are arranged at positions where the second drain upper layer wiring and the fourth drain middle layer wirings overlap each other in a plan view,
wherein second source upper side vias are arranged at positions where the second source upper layer wiring and the second source middle layer wirings overlap each other in a plan view, and
wherein fourth source upper side vias are arranged at positions where the second source upper layer wiring and the fourth source middle layer wirings overlap each other in a plan view.

16. The semiconductor integrated circuit of claim 2, further comprising:
a second H-bridge output stage including:
a third half-bridge output stage having a third high-side transistor of a P-channel type or N-channel type and a third low-side transistor of an N-channel type connected in series with the third high-side transistor; and
a fourth half-bridge output stage having a fourth high-side transistor of a P-channel type or N-channel type and a fourth low-side transistor of an N-channel type connected in series with the fourth high-side transistor, wherein a layout of a fifth transistor arrangement region in which the third high-side transistor is disposed, a sixth transistor arrangement region in which the third low-side transistor is disposed, a seventh transistor arrangement region in which the fourth high-side transistor is disposed, and an eighth transistor arrangement region in which the fourth low-side transistor is disposed is line-symmetric with the first to fourth transistor arrangement regions with respect to a symmetric axis extending in the first direction.

17. The semiconductor integrated circuit of claim 1, wherein each of the first high-side transistor and the second high-side transistor is a P-channel type.

18. The semiconductor integrated circuit of claim 17, wherein each of the first high-side transistor and the second high-side transistor is a PDMOS (P-channel DMOS (Double-Diffused MOSFET)), and wherein each of the first low-side transistor and the second low-side transistor is an NDMOS (N-channel DMOS).

19. A motor driver configured by packaging the semiconductor integrated circuit of claim 16.

20. A motor drive system comprising:
the motor driver of claim 19; and
a motor connected to the first half-bridge output stage and the second half-bridge output stage in the semiconductor integrated circuit.

* * * * *